(12) United States Patent  
Hsu et al.

(10) Patent No.: US 9,013,893 B2  
(45) Date of Patent: Apr. 21, 2015

(54) EMBEDDED CAPACITOR MODULE

(71) Applicant: Industrial Technology Research Institute, Hsinchu (TW)

(72) Inventors: Chien-Min Hsu, Hsinchu County (TW); Min-Lin Lee, Hsinchu (TW); Cheng-Liang Cheng, Hsinchu (TW); Li-Duan Tsai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 187 days.

(21) Appl. No.: 13/896,436

(22) Filed: May 17, 2013

(65) Prior Publication Data

US 2013/0248235 A1 Sep. 26, 2013

Related U.S. Application Data

(63) Continuation-in-part of application No. 13/197,283, filed on Aug. 3, 2011.

(30) Foreign Application Priority Data

Dec. 29, 2010 (TW) .................................. 099146695

(51) Int. Cl.
*H05K 1/18* (2006.01)
*H01L 23/498* (2006.01)
(Continued)

(52) U.S. Cl.
CPC .......... *H05K 1/185* (2013.01); *H01L 23/49822* (2013.01); *H01L 23/642* (2013.01);
(Continued)

(58) Field of Classification Search
USPC .................................. 361/763, 761, 764, 766
See application file for complete search history.

(56) References Cited

U.S. PATENT DOCUMENTS 6,215,372 B1 4/2001 Novak
6,274,224 B1 8/2001 O'Bryan et al.
(Continued)

FOREIGN PATENT DOCUMENTS

CN 1465214 A 12/2003
CN 1968576 A 5/2007
(Continued)

OTHER PUBLICATIONS

Bjoern Martin et al., Electrode effects in solid electrolyte capacitors, Journal of Applied Physics, 2005, 074102-1-8, vol. 98.
(Continued)

*Primary Examiner* — Andargie M Aychillhum
(74) *Attorney, Agent, or Firm* — Morris Manning & Martin LLP; Tim Tingkang Xia

(57) ABSTRACT

An embedded capacitor module includes an electrode lead-out portion and at least one solid electrolytic capacitor portion adjacently disposed with the electrode lead-out portion. The electrode lead-out portion comprises a first substrate, a second substrate, a first insulating material disposed between the first substrate and the second substrate, a first porous layer formed on at least one surface of the first substrate, and a first oxide layer disposed on the first porous layer. The solid electrolytic capacitor portion comprises the first substrate, the second substrate, the first porous layer, the first oxide layer, all of which are extended from the electrode lead-out portion, a first conductive polymer layer disposed on the first oxide layer, a first carbon layer disposed on the first conductive polymer layer, and a first conductive adhesive layer disposed on the first carbon layer.

35 Claims, 33 Drawing Sheets

(51) Int. Cl.
  *H01L 23/64* (2006.01)
  *H05K 1/02* (2006.01)
  *H05K 1/16* (2006.01)
  *H01L 23/50* (2006.01)
  H01L 23/00 (2006.01)
  H05K 3/46 (2006.01)
  H01G 4/33 (2006.01)

(52) U.S. Cl.
  CPC ............ H01L 24/16 (2013.01); *H05K 1/0231* (2013.01); *H05K 1/162* (2013.01); H05K 3/4608 (2013.01); H01L 2224/16235 (2013.01); H01L 2924/14 (2013.01); H01L 2924/19041 (2013.01); H05K 2201/0187 (2013.01); H05K 2201/09309 (2013.01); H05K 2203/0315 (2013.01); H01L 2224/16225 (2013.01); H05K 2201/0116 (2013.01); *H01L 23/50* (2013.01); *H01G 4/33* (2013.01)

(56) References Cited

U.S. PATENT DOCUMENTS

| | | | |
|---|---|---|---|
| 6,466,430 B2 | 10/2002 | Mido et al. | |
| 6,504,705 B2 | 1/2003 | Shimada et al. | |
| 6,510,045 B2 | 1/2003 | Mido et al. | |
| 6,775,125 B2 | 8/2004 | Kimura et al. | |
| 6,775,126 B2 | 8/2004 | Fujii et al. | |
| 6,822,849 B2 | 11/2004 | Miki et al. | |
| 6,836,401 B2 | 12/2004 | Yoshida et al. | |
| 6,852,137 B2 | 2/2005 | Miki et al. | |
| 6,855,177 B2 | 2/2005 | Fujii et al. | |
| 6,870,728 B1 | 3/2005 | Burket et al. | |
| 6,882,544 B2 | 4/2005 | Nakamura et al. | |
| 6,917,514 B2 | 7/2005 | Mido et al. | |
| 6,980,416 B2 | 12/2005 | Sakaguchi et al. | |
| 6,989,982 B2 | 1/2006 | Kobayashi et al. | |
| 7,009,834 B2 | 3/2006 | Arai et al. | |
| 7,042,709 B2 | 5/2006 | Kobayashi et al. | |
| 7,054,141 B2 | 5/2006 | Sakaguchi et al. | |
| 7,126,811 B2 | 10/2006 | Hirano et al. | |
| 7,158,366 B2 | 1/2007 | Kobayashi et al. | |
| 7,169,195 B2 | 1/2007 | Sakaguchi et al. | |
| 7,227,739 B2 | 6/2007 | Kobayashi | |
| 7,247,178 B2 | 7/2007 | Hirano et al. | |
| 7,304,833 B1 | 12/2007 | Kobayashi | |
| 7,317,610 B2 | 1/2008 | Nakamura et al. | |
| 7,319,599 B2 | 1/2008 | Hirano et al. | |
| 7,361,568 B2 | 4/2008 | Dunn et al. | |
| 7,595,235 B2 | 9/2009 | Arai et al. | |
| 8,053,673 B2 | 11/2011 | Kim et al. | |
| 2005/0152097 A1* | 7/2005 | Sakaguchi et al. | 361/523 |
| 2008/0216296 A1 | 9/2008 | Prymak et al. | |
| 2009/0211799 A1* | 8/2009 | Nagase et al. | 174/262 |
| 2010/0319973 A1 | 12/2010 | Fan | |

FOREIGN PATENT DOCUMENTS

| | | |
|---|---|---|
| TW | 200703388 | 1/2007 |
| TW | 200822302 | 5/2008 |

OTHER PUBLICATIONS

Stura E et al., Hybrid organic-inorganic electrolytic capacitors, IEEE Trans Nanobioscience, 2002, Abstract only.

Yang Rao et al., Novel Ultra-high Dielectric Constant Polymer Based Composite Development for Embedded Capacitor Application, IEEE, Electronics Packaging Technology Conference, 2002, 65-69.

K. J. Lim et al., Dielectric Properties of Aluminium Solid Electrolytic Capacitor using Conduction Polymer, IEEE, Proceedings of the 4th International Conference on Properties and Applications of Dielectric Materials, 1994, 223-226.

Donald R. Cahela et al., Overview of Electrochemical Double Layer Capacitors, 1068-1073.

State Intellectual Property Office of the People's Republic of China, "Office Action", Jul. 1, 2013, China.

Intellectual Property Office, Ministry of Economic Affairs, R.O.C., "Notice of Allowance", Jun. 28, 2013, Taiwan.

* cited by examiner

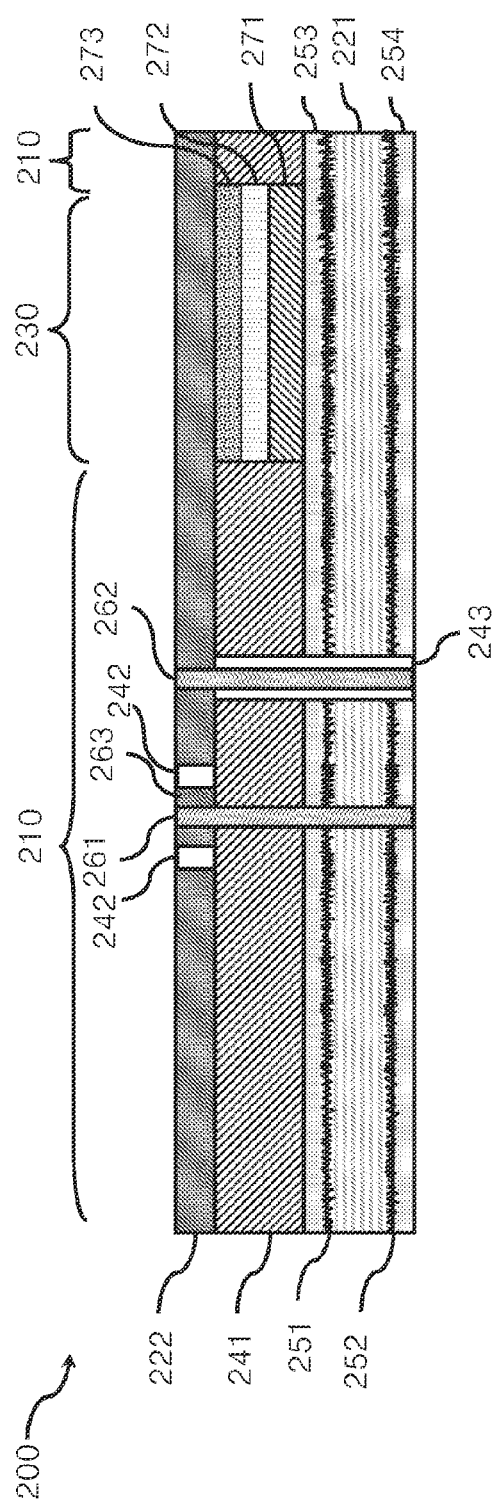
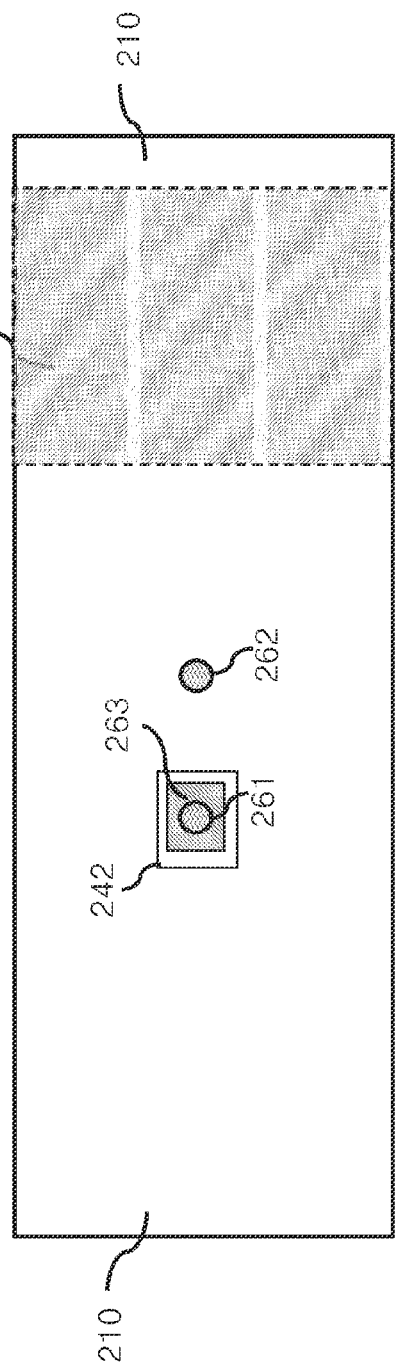
FIG. 7A
FIG. 7B

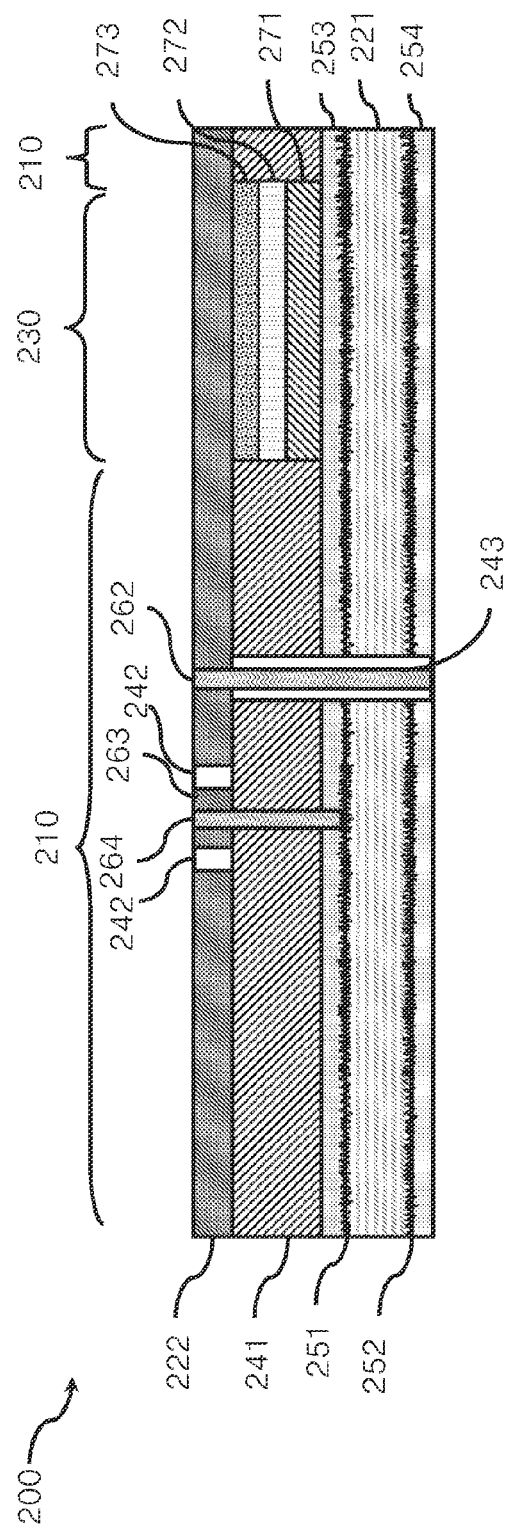
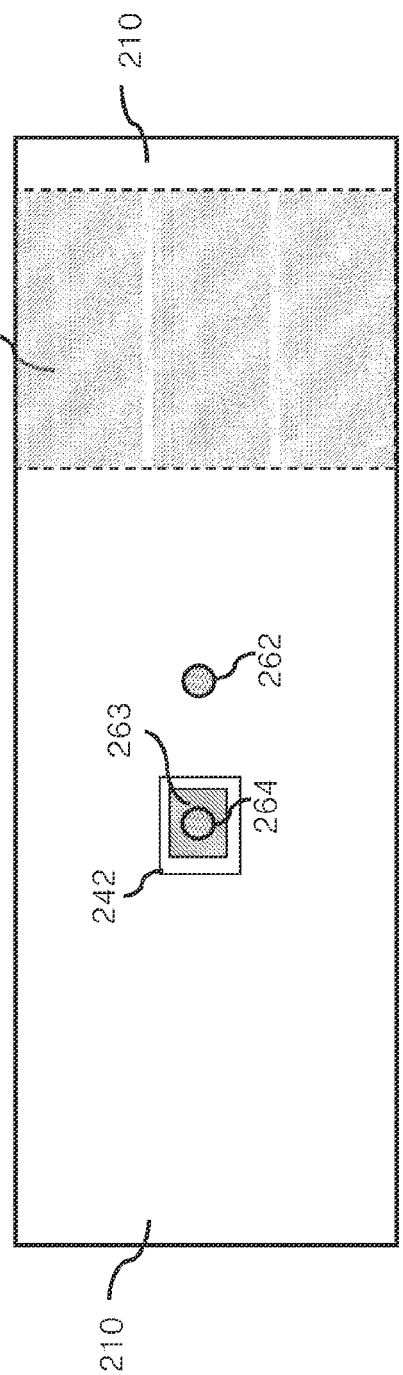
FIG. 8A
FIG. 8B

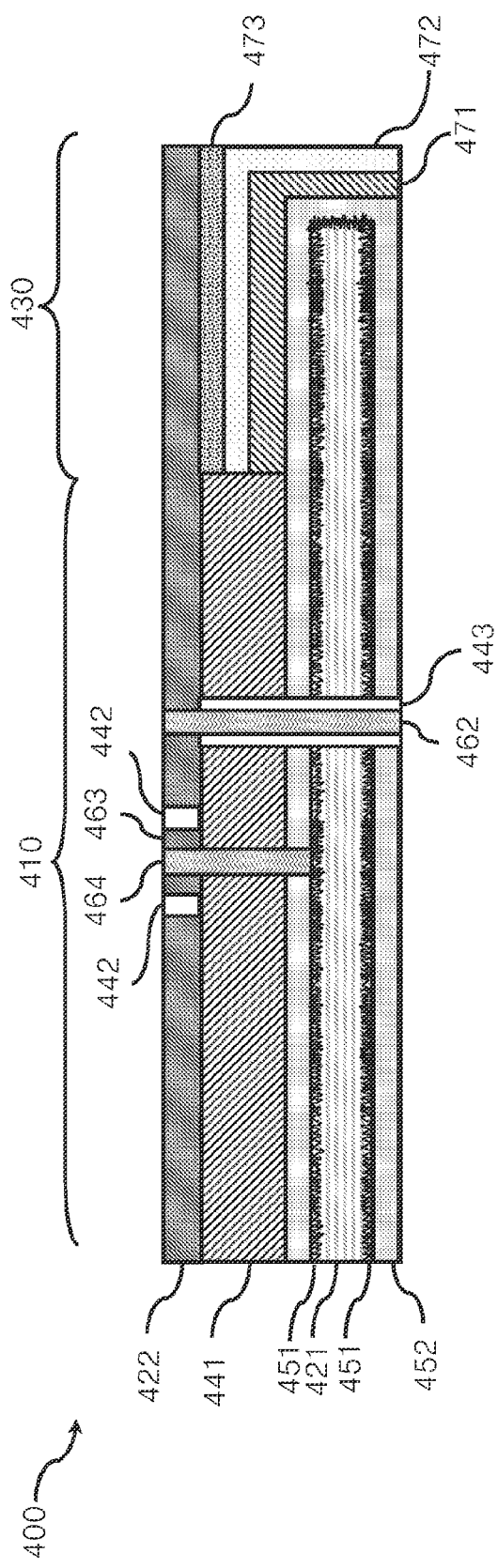
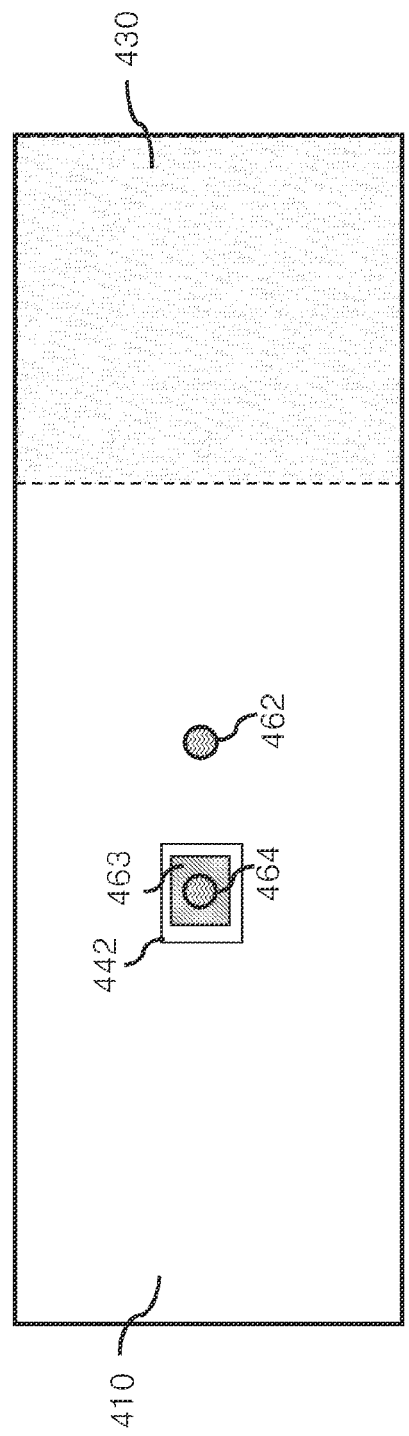
FIG. 12A
FIG. 12B

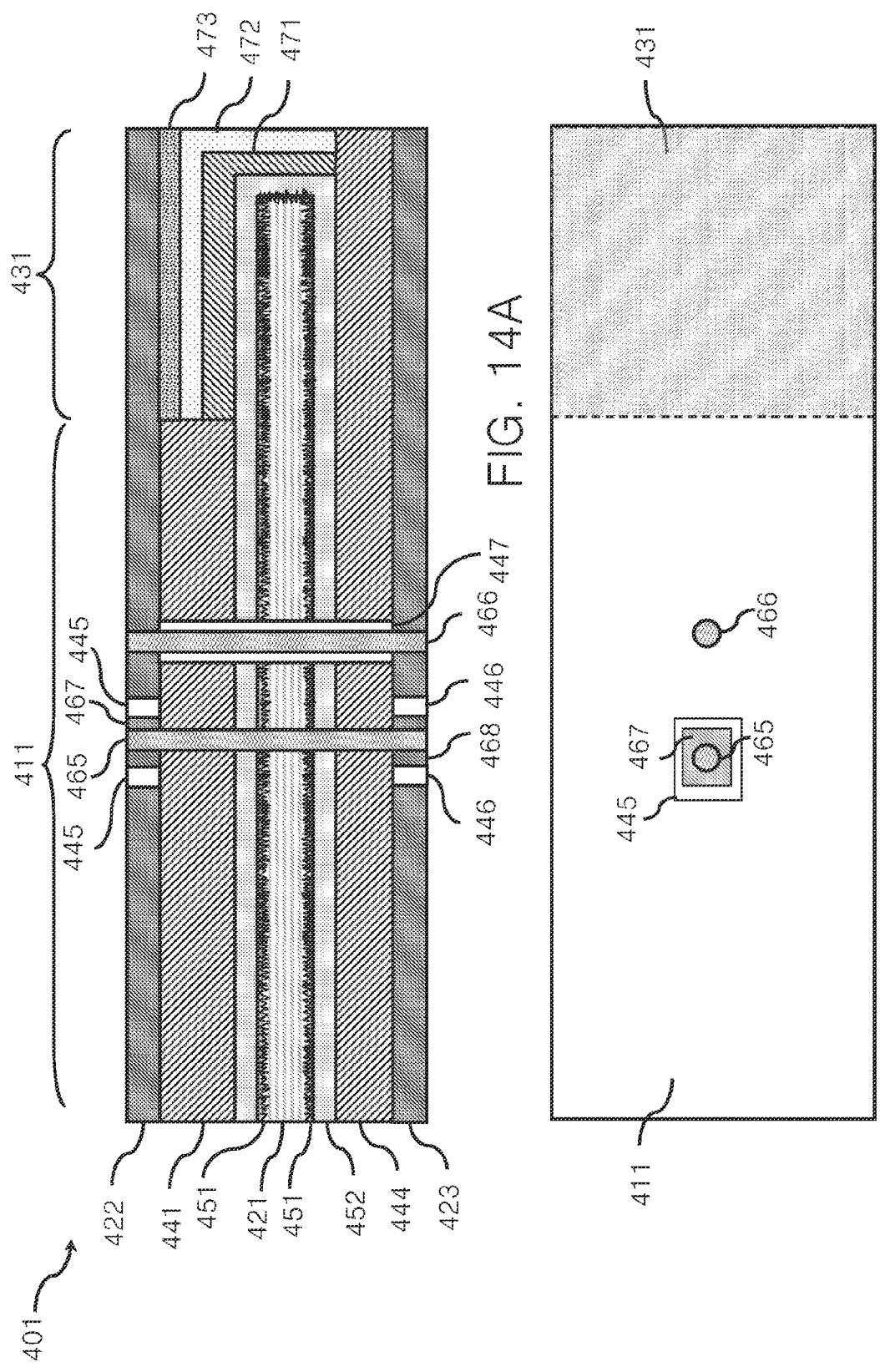

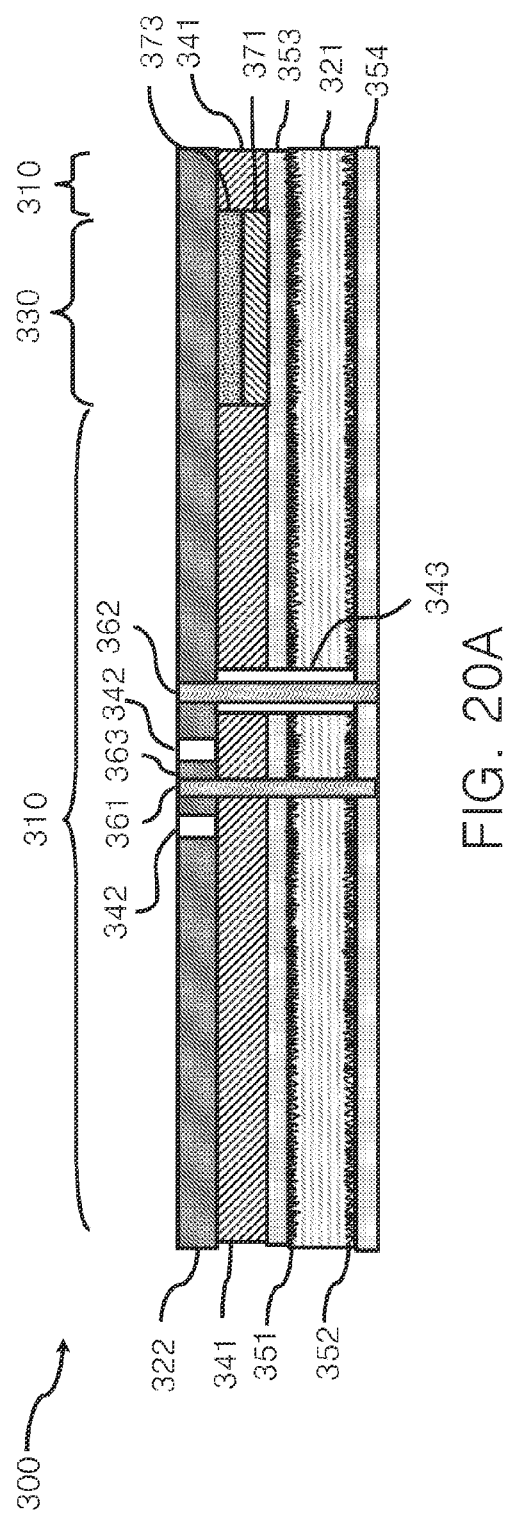
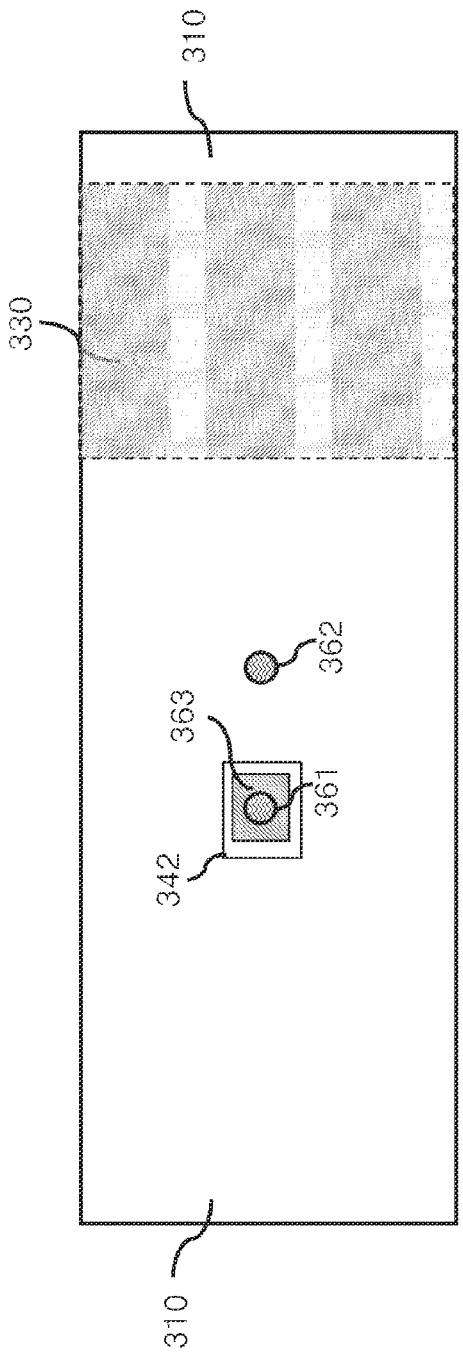
FIG. 20A
FIG. 20B

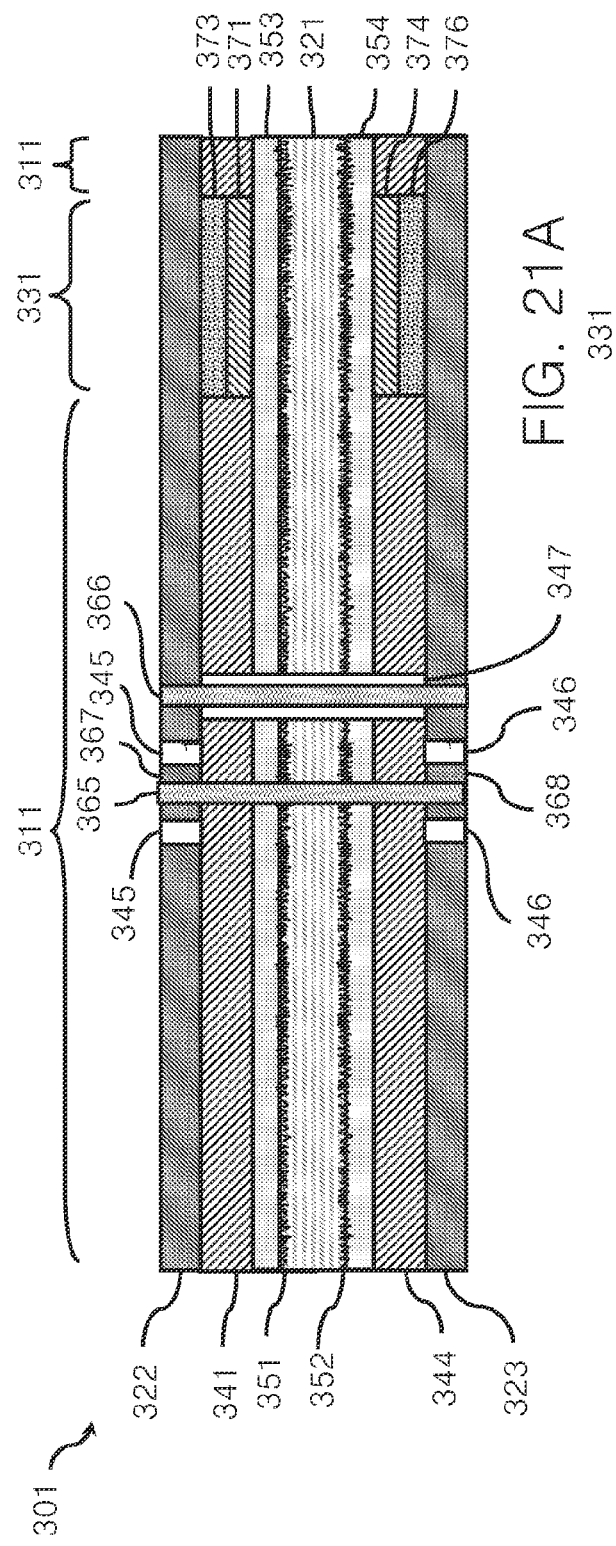
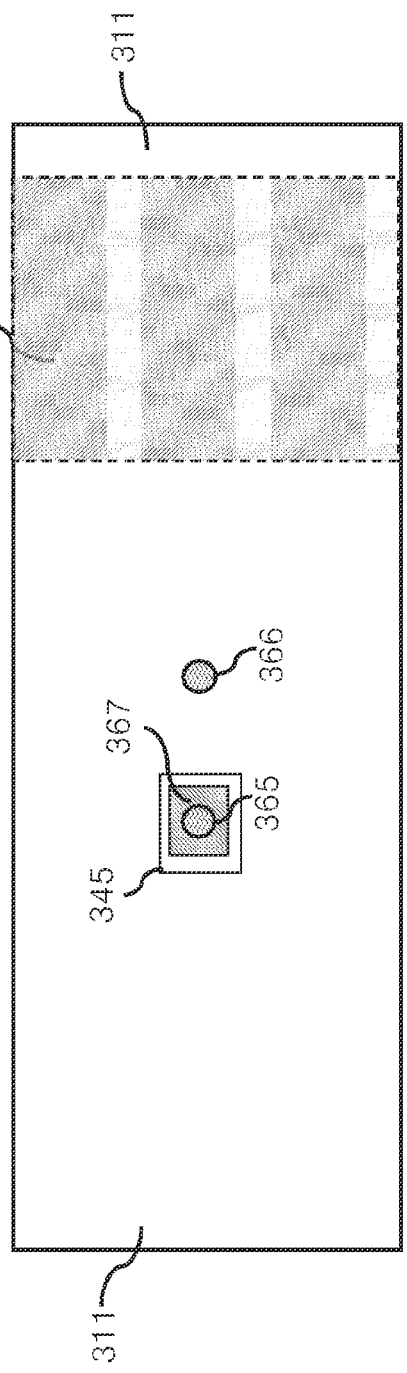
FIG. 21A
FIG. 21B

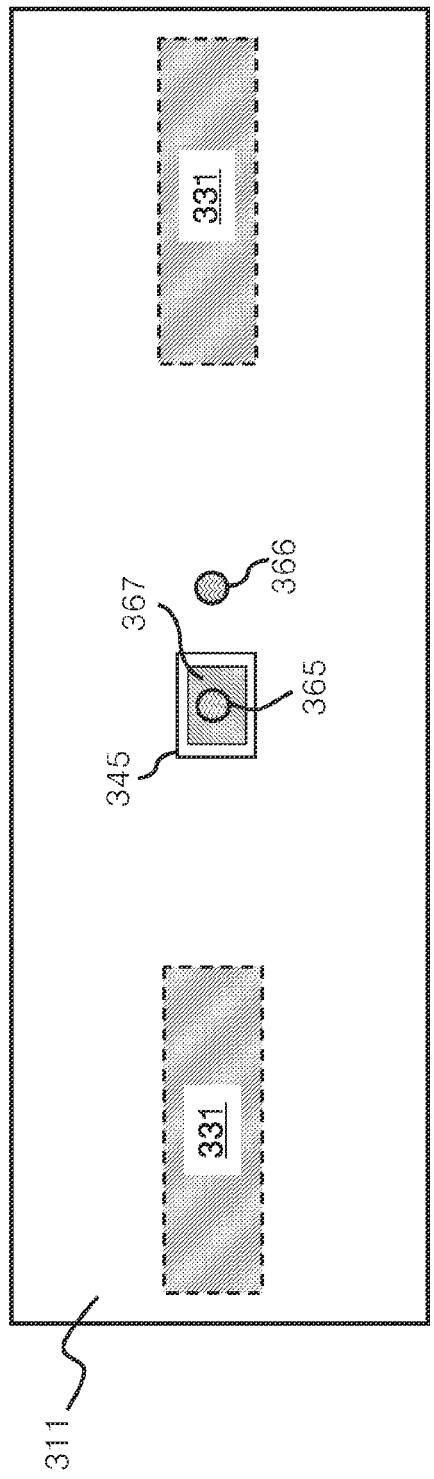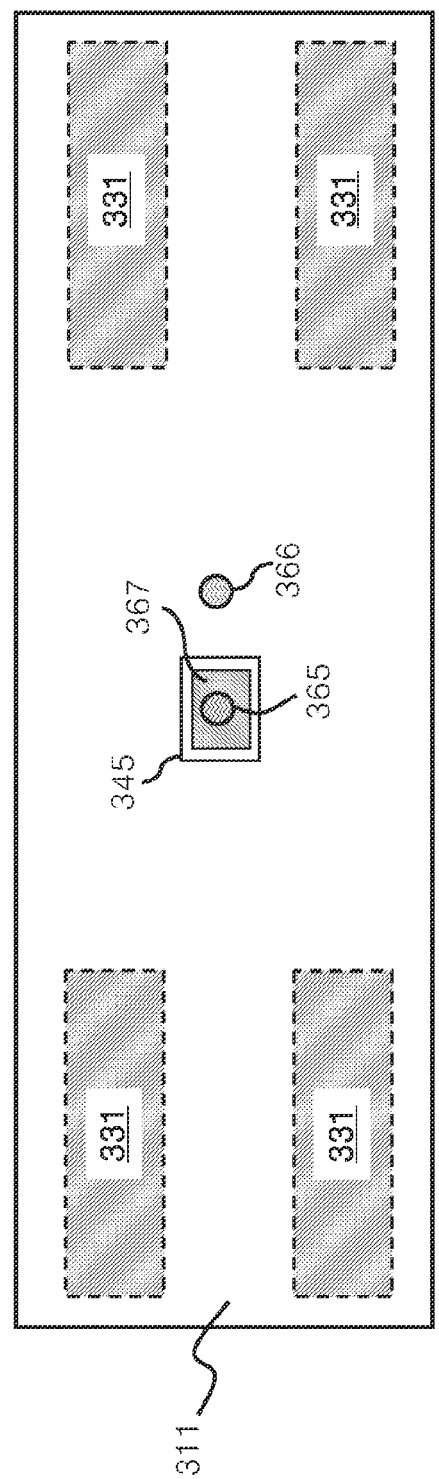

EMBEDDED CAPACITOR MODULE

CROSS-REFERENCE TO RELATED APPLICATIONS

This application is a continuation-in-part patent application of U.S. application Ser. No. 13/197,283 filed on Aug. 3, 2011 which claims priority under 35 U.S.C. §119(a) on Patent Application No(s). 099146695 filed in Taiwan, R.O.C. on Dec. 29, 2010, the entire contents of which are hereby incorporated by reference.

TECHNICAL FIELD

The disclosure relates to an embedded capacitor module, and relates to an embedded capacitor module using a solid electrolytic capacitor structure to increase the capacitance.

BACKGROUND

With the continuous improvement of integrated circuit (IC) process technologies, the development of portable electronic products demands for light, thin, short, small, high speed, low power consumption and multifunction features. Due to the increase of the signal transmission speed, an IC carrier board is required to transmit signals with higher frequencies, and the interference generated by synchronous switching is aggravated accordingly. To reduce noises of a power delivery system on the IC carrier board, the current high-speed IC carrier board uses several surface mounted devices (SMD) capacitors to filter the noises. Such a capacitor is generally referred to as a decoupling capacitor or a bypass capacitor, mainly for storing rated electric power and supplying the electric power when needed, thereby achieving the effects of absorbing the glitch, reducing the radio frequency (RF) noises and stabilizing the power.

However, to provide an impedance path with a lower and wider frequency band, tens to hundreds of SMD capacitors need to be placed on the IC carrier board, and the capacitors are connected in parallel to achieve the purpose of reducing the low-frequency or high-frequency impedance. With the continuous rise of the IC signal transmission speed in the future and the limited area of the IC carrier board, an equivalent series inductance (ESL) that can be reduced by the SMD capacitors placed on the surface of the IC carrier board is inevitably suppressed.

Compared with the manner of welding the SMD capacitor on the surface of the printed circuit board or the IC carrier board, the manner of embedding the capacitor in the printed circuit board or the IC carrier board enables the capacitor to be closer to a power pin of an IC device, so that the ESL generated by a power delivery path of the capacitor embedded in the substrate at a high frequency is lower than that of the SMD capacitor. Compared with the decoupling capacitor device placed on the surface of the printed circuit board, the decoupling capacitor device embedded in the substrate is placed at a position closer to the IC, and the technology of embedding the capacitor in the substrate is one of the current methods for reducing the ESL generated by the power delivery path of the IC carrier board.

Although the technology of embedding the decoupling capacitor in the substrate is in having a low ESL, restricted by the specification of current leakage of the insulating material, the dielectric constant of the current organic insulating material is hard to exceed 100, and consequently the layers of the embedded planar capacitor can be increased upon the limited thickness and area of the substrate, so as to make the capacitance higher than 0.1 uF, which reduces the process yield and also increases the fabrication cost of the substrate. Furthermore, the capacitance provided by the technology of embedding the capacitor in the substrate cannot meet the demand for hundreds of uF capacitance of the IC carrier board currently. Therefore, it is a problem of the current technology of embedding the capacitor in the substrate in need of solution on how to increase the capacitance of the capacitor embedded in the substrate and increase the effective decoupling bandwidth.

SUMMARY

An embedded capacitor module according to an embodiment of the disclosure comprises an electrode lead-out portion and at least one solid electrolytic capacitor portion adjacently disposed with the electrode lead-out portion. The electrode lead-out portion comprises a first substrate, a second substrate, a first insulating material disposed between the first substrate and the second substrate, a first porous layer formed on at least one surface of the first substrate, and a first oxide layer disposed on the first porous layer. The solid electrolytic capacitor portion comprises the first substrate extended from the electrode lead-out portion, the second substrate extended from the electrode lead-out portion, the first porous layer extended from the electrode lead-out portion and formed on at least one surface of the first substrate extended from the electrode lead-out portion, the first oxide layer extended from the electrode lead-out portion and disposed on the first porous layer extended from the electrode lead-out portion, a first conductive polymer layer disposed on the first oxide layer, a first carbon layer disposed on the first conductive polymer layer, and a first conductive adhesive layer disposed on the first carbon layer, wherein the first conductive adhesive layer is electrically connected to the second substrate and the first carbon layer, and the first insulating material contacts with at least one side of the first conductive polymer layer, the first carbon layer and the first conductive adhesive layer.

An embedded capacitor module according to another embodiment of the disclosure comprises at least one electrode lead-out portion and at least one solid electrolytic capacitor portion disposed adjacently with the electrode lead-out portion. The electrode lead-out portion comprises a first substrate, a second substrate, a first insulating material disposed between the first substrate and the second substrate, a first porous layer formed on the surface of the first substrate, and a first oxide layer disposed on the porous layer. The solid electrolytic capacitor portion comprises the first substrate extended from the electrode lead-out portion, the second substrate extended from the electrode lead-out portion, the first porous layer extended from the electrode lead-out portion and formed on at least one surface of the first substrate extended from the electrode lead-out portion, the first oxide layer extended from the electrode lead-out portion and disposed on the first porous layer extended from the electrode lead-out portion, a first conductive polymer layer disposed on the first oxide layer, and a first conductive adhesive layer disposed on the first conductive polymer layer, wherein the first conductive adhesive layer is electrically connected to the second substrate and the first conductive polymer layer, and the first insulating material contacts with at least one side of the first conductive polymer layer and the first conductive adhesive layer.

BRIEF DESCRIPTION OF THE DRAWINGS

The appended drawings contain figures of exemplary embodiments to further clarify the above of the invention. It will be appreciated that these drawings depict exemplary embodiments of the invention and are not intended to limits its scope. The invention will be described and explained with additional specificity and detail through the use of the accompanying drawings in which:

FIG. 7A and FIG. 7B are cross-section structural and top views of an embedded capacitor module according to another embodiment of the disclosure.

FIG. 8A and FIG. 8B are cross-section structural and top views of an embedded capacitor module according to another embodiment of the disclosure.

FIG. 12A and FIG. 12B are cross-section structural and top views of an embedded capacitor module according to another embodiment of the disclosure.

FIG. 14A and FIG. 14B are cross-section structural and top views of an embedded capacitor module according to another embodiment of the disclosure.

FIG. 20A and FIG. 20B are cross-section structural and top views of an embedded capacitor module according to another embodiment of the disclosure.

FIG. 21A and FIG. 21B are cross-section structural and top views of an embedded capacitor module according to another embodiment of the disclosure.

FIG. 22A FIG. 22B, and FIG. 22C are cross-section structural and top views of an embedded capacitor module according to another embodiment of the disclosure.

DETAILED DESCRIPTION OF THE DISCLOSURE

Figure 1:
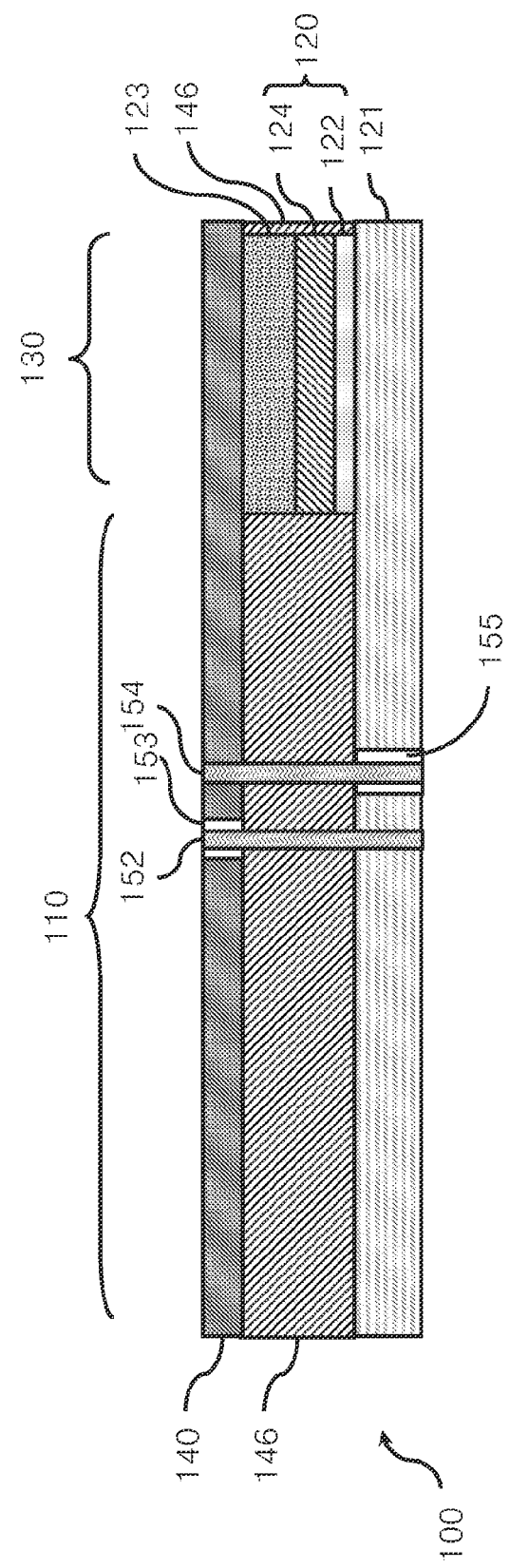
FIG. 1 is a schematic structural view of an embedded capacitor module according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It should be illustrated that the thickness and size of every layer and the relative ratio between all the layers in the figures of the following embodiments are exemplary in the disclosure, and may be adjusted according to practical requirements by those of ordinary skill in the art. However, the disclosure may be implemented in different forms, but is not limited to the embodiments of the disclosure. In the drawings, to make it clear, the sizes and relative sizes of the layers and regions may be amplified and/or simplified. It should be noted that when a device or a layer is stated as being "on" another device or layer, "connected to" or "coupled to" another device or layer, the device or layer may be directly placed on another device or layer or an intermediate device or layer may exist. Furthermore, although several embodiments are mentioned hereinafter, in the drawings, the same devices are indicated by identical reference numerals. The use of the same reference number throughout the several figures designates a like or similar element, and thus detailed description is omitted.

In view of the problem that the current technology of embedding the capacitor in the substrate cannot greatly improve the capacitance, an embedded capacitor module using a solid electrolytic capacitor is provided in the disclosure to solve the problem in the prior art.

FIG. 1 is a schematic structural view of an embedded capacitor module according to an embodiment of the disclosure. As shown in FIG. 1, the embedded capacitor module 100 comprises a solid electrolytic capacitor material 120, a metal substrate 121 and a substrate 140. The solid electrolytic capacitor material 120, a part of the metal substrate 121 and a part of the substrate 140 form a solid electrolytic capacitor 130. The remaining part of the metal substrate 121 and the remaining part of the substrate 140 is defined as an electrode lead-out region 110. The rest region is filled by an insulating material 146. The insulating material 146, which is formed on an area other than the area the solid electrolytic capacitor is formed may be, but not limited to, resin or a dielectric material. In one embodiment, the metal substrate 121 is formed to have scraggy surfaces by way of, but not limited to, etching process to increase the surface area of the metal substrate 121.

The solid electrolytic capacitor material 120 is formed on one side of the metal substrate 121. The solid electrolytic capacitor material 120 comprises, but not limited to, an aluminum oxide layer 122 and a conductive polymer layer 124. It can be known from the figure that the conductive polymer layer 124 is formed on the aluminum oxide layer 122, and the material of the conductive polymer layer 124 may be, but not limited to, poly(3,4-ethylenedioxythiophene) (PEDOT). The metal substrate 121 generally is, but not limited to, an aluminum substrate.

One side of the solid electrolytic capacitor material 120 is in contact with the metal substrate 121, and the other side of the solid electrolytic capacitor material 120 is bonded with the substrate 140 through a conductive adhesive layer 123. That is, the substrate 140 is electrically connected to the conductive adhesive layer 123 and the conductive polymer layer 124. In an embodiment, the conductive adhesive layer 123 may be, but not limited to, carbon paste or an equivalent thereof. The material of the substrate 140 may be, but not limited to, copper or silver.

In the embodiment of FIG. 1, an electrode lead-out region 110 is formed outside the region where the solid electrolytic capacitor 130 is formed. The electrode lead-out region 110 is formed by extending the substrate 140 and the metal substrate 121 of the solid electrolytic capacitor 130. A solid electrolytic capacitor is formed in a region between a large-area metal substrate (the metal substrate 121 of the solid electrolytic capacitor 130) and the substrate 140, and the insulating material 146 is filled in the rest region between the metal substrate 121 and the substrate 140. The area in the horizontal direction of the metal substrate 121 of the embedded capacitor module 100 is greater than the area in the horizontal direction of the solid electrolytic capacitor 130. Due to the large-area metal substrate and substrate structure, that is, the electrode lead-out region 110 formed by extending, a drilling or plating process can be directly performed on the substrate structure without destroying the electrolytic capacitor structure, so that the embedded solid electrolytic capacitor module can be electrically connected to other outer or inner circuits.

For example, the embedded solid electrolytic capacitor module is electrically connected to the external circuit by connecting to the metal substrate 121 through a first via 152 and connecting to the substrate 140 through a second via 154. In this embodiment, the metal substrate 121 serves as a first electrode, and the substrate 140 serves as a second electrode. The positive and negative polarities of the first electrode and the second electrode are opposite to each other.

In this embodiment, the first via 152 and the second via 154 both penetrate the entire module, but since the first via 152 connects the metal substrate 121 and the second via 154 connects the substrate 140, the first via 152 is insulated from the substrate 140, and the second via 154 is insulated from the metal substrate 121. As shown in the figure, an insulating material 153 is formed around the first via 152 penetrating the substrate 140, and an insulating material 155 is formed around the second via 154 penetrating the metal substrate 121.

Figure 2A:
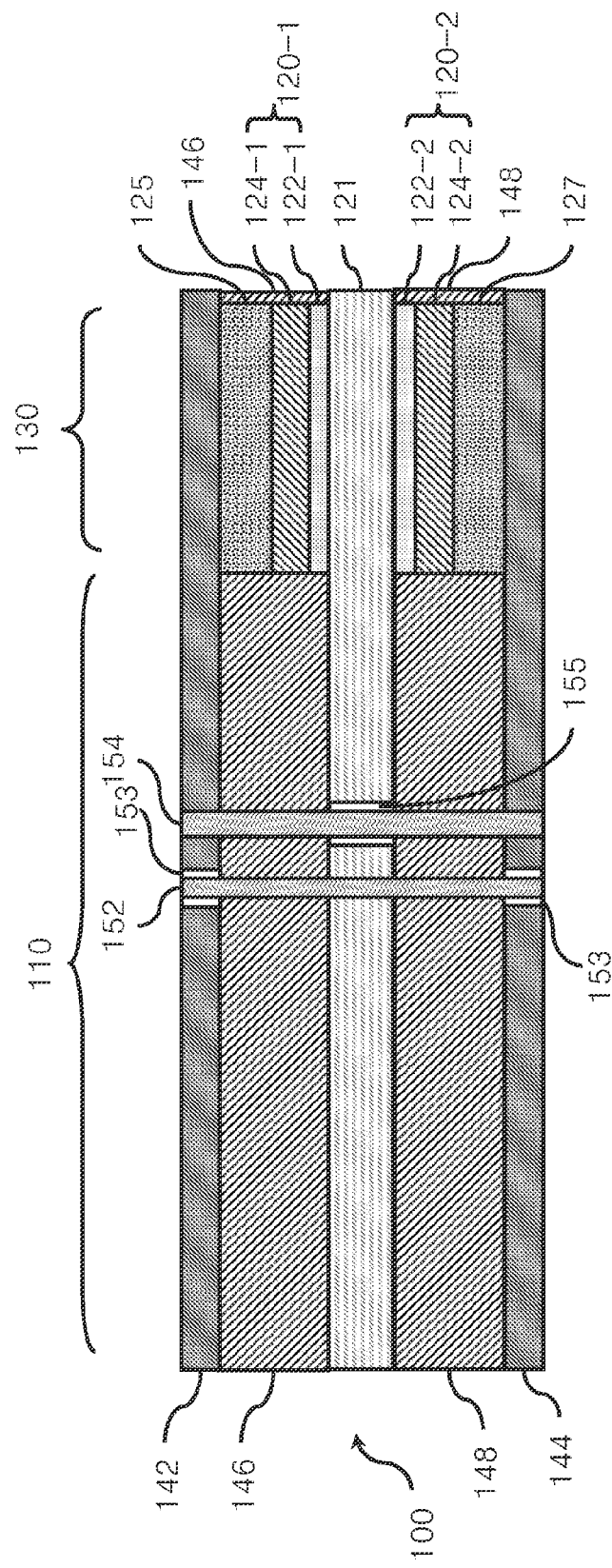
FIG. 2A and FIG. 2B are schematic structural views of the embedded capacitor module according to another embodiment of the disclosure.
Figure 2B:
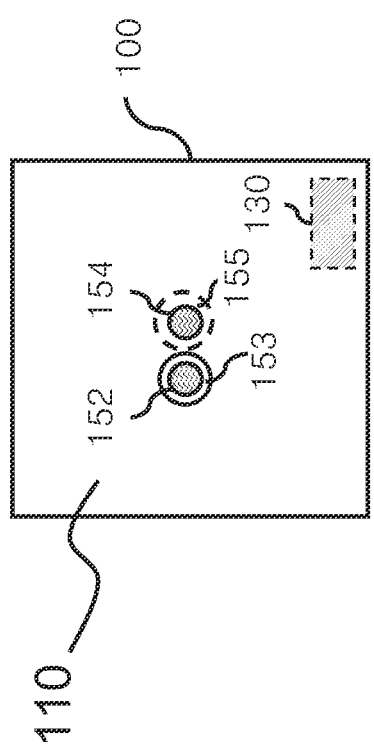

FIG. 2A and FIG. 2B are schematic structural views of the embedded capacitor module according to another embodiment of the disclosure, in which FIG. 2A is a side view and FIG. 2B is a top view. As shown in FIG. 2A and FIG. 2B, the embedded capacitor module 100 comprises two layers of solid electrolytic capacitor material 120-1, 120-2, a metal substrate 121, an upper substrate 142 and a lower substrate 144. One of the two layers of solid electrolytic capacitor material 120-1, a part of the metal substrate 121 and a part of the upper substrate 142 form a solid electrolytic capacitor 130. Likewise, the other one of the two layers of solid electrolytic capacitor material 120-2, a part of the metal substrate 121 and a part of the lower substrate 144 also form a solid electrolytic capacitor 130. The remaining part of the metal substrate 121 and the remaining part of the upper substrate 142 and the lower substrate 144 extend to form an electrode lead-out region 110. In this embodiment, the solid electrolytic capacitor material 120-1 is formed on the upper surface of the metal substrate 121 and the solid electrolytic capacitor material 120-2 is formed on the lower surface of the solid electrolytic capacitor material 120-2. That is, the solid electrolytic capacitor material is respectively formed between the upper substrate 142 and the metal substrate 121 and between the lower substrate 144 and the metal substrate 121. In another embodiment, a solid electrolytic capacitor may be optionally formed, that is, formed between the upper substrate 142 and the metal substrate 121 or formed between the lower substrate 144 and the metal substrate 121.

One side of the solid electrolytic capacitor material 120-1 not bonded with the metal substrate 121 is bonded with the upper substrate 142 through a first conductive adhesive layer 125, and one side of the solid electrolytic capacitor material 120-2 not bonded with the metal substrate 121 is bonded with the lower substrate 144 through a second conductive adhesive layer 127. That is, the upper substrate 142 is electrically connected to the conductive adhesive layer 125 and the conductive polymer layer 124-1. The substrate 144 is electrically connected to the conductive adhesive layer 127 and the conductive polymer layer 124-2. In an embodiment, the material of the first conductive adhesive layer 125 and/or the second conductive adhesive layer 127 may be, but not limited to, carbon paste or other conductive material. The material of the upper substrate 142 and the lower substrate 144 may be, but not limited to, copper or silver.

The solid electrolytic capacitor material 120-1 is formed being of, but not limited to, a two-layered structure. The solid electrolytic capacitor material 120-1 comprises, but are not limited to, aluminum oxide layers 122-1 and conductive polymer layers 124-1. Likewise, the solid electrolytic capacitor material 120-2 is formed being of, but not limited to, a two-layered structure. The solid electrolytic capacitor material 122-2 comprises, but are not limited to, aluminum oxide layers 122-2 and conductive polymer layers 124-2. The two aluminum oxide layers 122-1 and 122-2 are respectively formed on two surfaces of the metal substrate 121, and the two conductive polymer layers 124-1 and 124-2 are respectively formed on the two aluminum oxide layers 122-1 and 122-2. The insulating materials 146, 148 are respectively formed between the metal substrate 121 and the upper substrate 142 and between the metal substrate 121 and the lower substrate 144, and the insulating materials 146, 148 may be, but not limited to, resin or a dielectric material.

In the embodiment of FIG. 2A, an electrode lead-out region 110 is further formed outside the region where the solid electrolytic capacitor 130 is formed. The electrode lead-out region 110 is formed by extending the upper substrate 142, the lower substrate 144, the metal substrate 121, and the insulating materials 146, 148 respectively formed between the metal substrate 121 and the upper substrate 142 and between the metal substrate 121 and the lower substrate 144. The solid electrolytic capacitor 120-1 and 120-2 are respectively formed in a region between the large-area metal substrate 121 and the upper substrate 142 and between the large-area metal substrate 121 and the lower substrate 144, and the insulating materials 146, 148 are respectively formed, by laminated or other fabricated process, in the rest region between the metal substrate 121 and the upper substrate 140 and between the metal substrate 121 and the lower substrate 144. The areas in the horizontal direction of the metal substrate 121, the upper substrate 142 and the lower substrate 144 of embedded capacitor module 100 are greater than the area in the horizontal direction of the solid electrolytic capacitor 130. Because the area of the metal substrate 121 is greater than that of the solid electrolytic capacitor 130, that is, the electrode lead-out region 110 formed by extending, a drilling or via plating process can be directly performed on the electrode lead-out region 110 without destroying the electrolytic capacitor structure, so that the embedded solid electrolytic capacitor module can be electrically connected to other outer or inner circuits. In one embodiment, the metal substrate 121 is formed to have scraggy surfaces by way of, but not limited to, etching process to increase the surface area of the metal substrate 121.

For example, the embedded solid electrolytic capacitor module is electrically connected to the external circuit by connecting to the metal substrate 121 through the first via 152 and connecting to the upper substrate 142 and the lower substrate 144 through the second via 154, the positions of which are shown in FIG. 1B. In this case, the metal substrate 121 serves as a first electrode, and at least one of the upper substrate 142 and the lower substrate 144 serves as a second electrode. The negative and positive polarities of the first electrode and the second electrode are opposite to each other. Although the second via 154 connects the upper substrate 142 and the lower substrate 144, but when one layer of solid electrolytic capacitor is formed, the second via 154 may also connect one of the upper substrate 142 and the lower substrate 144.

In this embodiment, the first via 152 and the second via 154 both penetrate the entire module, but since the first via 152 connects the metal substrate 121 and the second via 154 connects the upper substrate 142 and the lower substrate 144, the first via 152 is insulated from the upper substrate 142 and the lower substrate 144, and the second via 154 is insulated from the metal substrate 121. As shown in the figure, an insulating material 153 is formed around the first via 152 penetrating the upper substrate 142 and the lower substrate 144, and an insulating material 155 is formed around the second via 154 penetrating the metal substrate 121.

To improve the capacitance of the embedded planar capacitor of the IC carrier board, the embedded solid electrolytic capacitor module described above and hereinafter may be integrated in the printed circuit board. Different from the solid capacitor in the prior art, the area of the metal substrate 121 and the substrate 140 (in the embodiment of FIG. 1) or the area (that is, the electrode lead-out region) of the metal substrate 121 and the upper substrate 142 and the lower substrate 144 (in the embodiment of FIG. 2A) of the solid electrolytic capacitor module of this structure is greater than that of the region (that is, the solid electrolytic capacitor 130, indicated by the slash region as shown in FIG. 2B) where the capacitance induced charges are actually generated. This structure has the feature that after the solid electrolytic capacitor module is embedded in or laminated in the circuit board through a process of the printed circuit board, a drilling or plating process can be performed on the substrate area outside the slash region, so that the embedded solid electrolytic capacitor module can be electrically connected to other outer or inner circuits to provide a large capacitor in the circuit through the plated-through-holes. In the prior art, the via is formed in or on the solid electrolytic capacitor to realize the connection of the capacitor and the external device.

It can be seen from FIG. 2A that, the solid electrolytic capacitor of the embedded capacitor module 100 has two layers. Definitely, the solid electrolytic capacitor may also be designed as one layer according to practical requirements, and in this case, it still needs to be electrically connected to the upper substrate 142 or the lower substrate 144 through a conductive adhesive layer. When one of the layers is selected, at least one of the upper substrate 142 and the lower substrate 144 serves as the electrode.

Figure 3A:
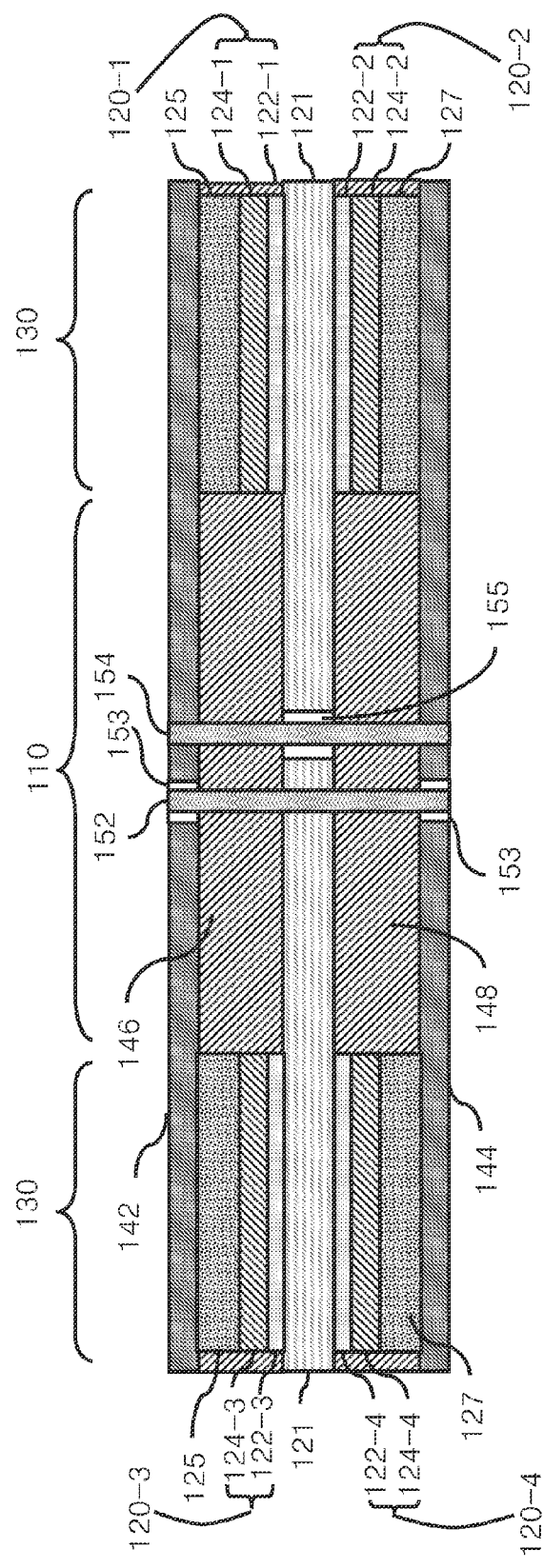
FIG. 3A and FIG. 3B are schematic structural views of the embedded capacitor module according to another embodiment of the disclosure.
Figure 3B:
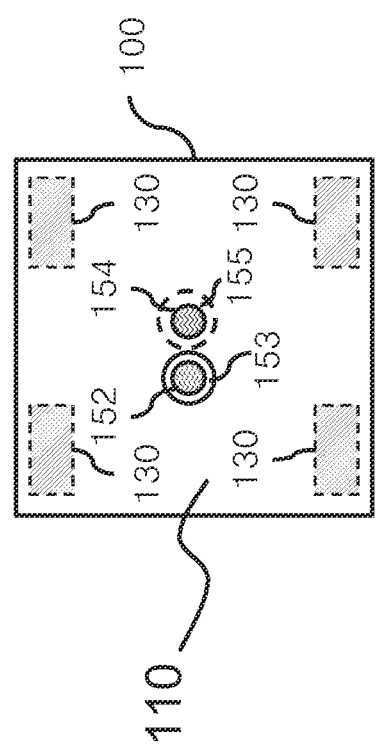
Figure 4A:
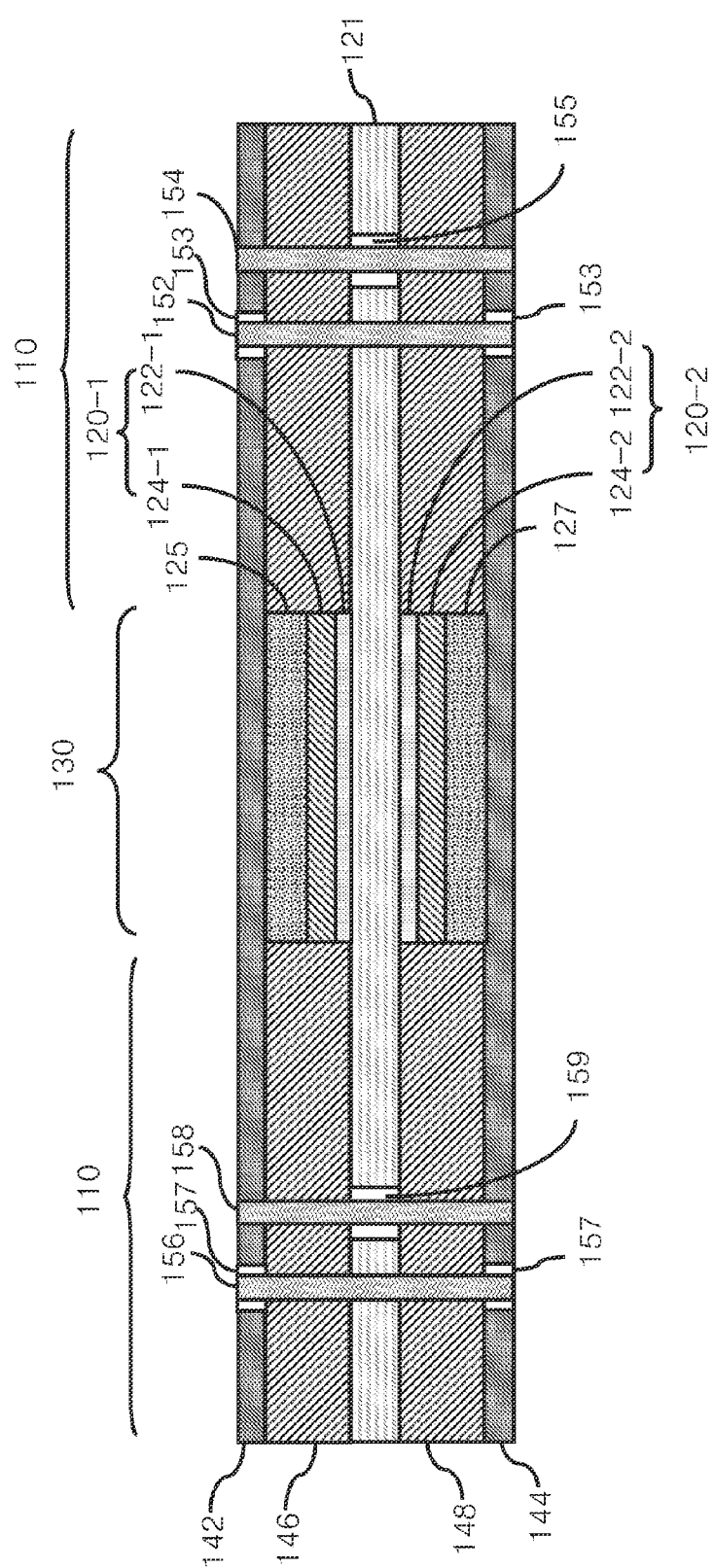
FIG. 4A and FIG. 4B are schematic structural views of the embedded capacitor module according to another embodiment of the disclosure.
Figure 4B:
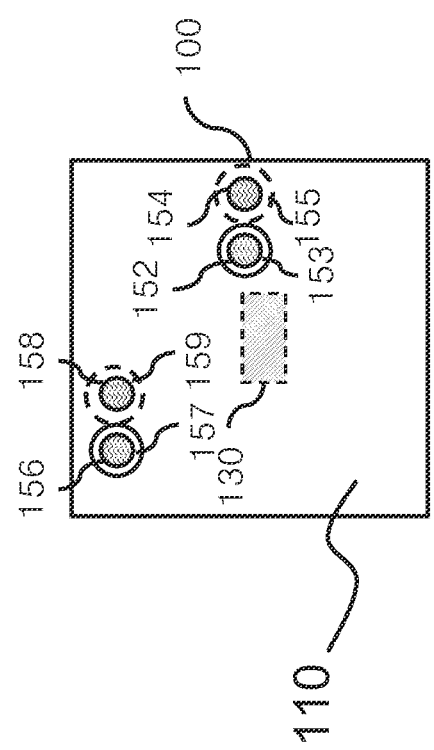

It can be seen from FIG. 2B that, the solid electrolytic capacitor 130 is disposed at one of the four corners of the embedded capacitor module 100, and the first via 152 and the second via 154 are substantially disposed at the center, that is, the electrode lead-out region 110 of the embedded capacitor module 100. The positions of the solid electrolytic capacitor and the first via 152 and the second via 154 are not fixed, and can be changed according to actual circuit design or system requirements. For example, in another embodiment of FIG. 3A and FIG. 3B, the solid electrolytic capacitor 130 is respectively disposed at all the four corners of the embedded capacitor module 100, and the rest part is the electrode lead-out region 110. Besides the similar components illustrated in FIG. 2A and FIG. 2B, this embodiment further includes a solid electrolytic capacitor material 120-3 and a solid electrolytic capacitor material 120-4. The solid electrolytic capacitor material 120-3 includes an aluminum oxide layer 122-3 and a conductive polymer layer 124-3. The solid electrolytic capacitor material 120-4 includes an aluminum oxide layer 122-4 and a conductive polymer layer 124-4. The structures are similar to the aforementioned embodiment, and thus details are omitted. Also, in another embodiment of FIG. 4A and FIG. 4B, the solid electrolytic capacitor 130 is disposed at the center of the embedded capacitor module 100, and the rest part is the electrode lead-out region 110. The first via 152 and the second via 154 are disposed on one side of the solid electrolytic capacitor 130, and it can be known from the figure that a third via 156 may be designed to connect the metal substrate 121 and a fourth via 158 may be designed to connect the upper substrate 142 and the lower substrate 144. The third via 156 may be electrically connected to the power, and the fourth via 158 may be electrically connected to the ground. As shown in FIG. 4A, an insulating material 157 is formed around the third via 156 penetrating the upper substrate 142 and the lower substrate 144, and an insulating material 159 is formed around the fourth via 158 penetrating the metal substrate 121.

Figure 5:
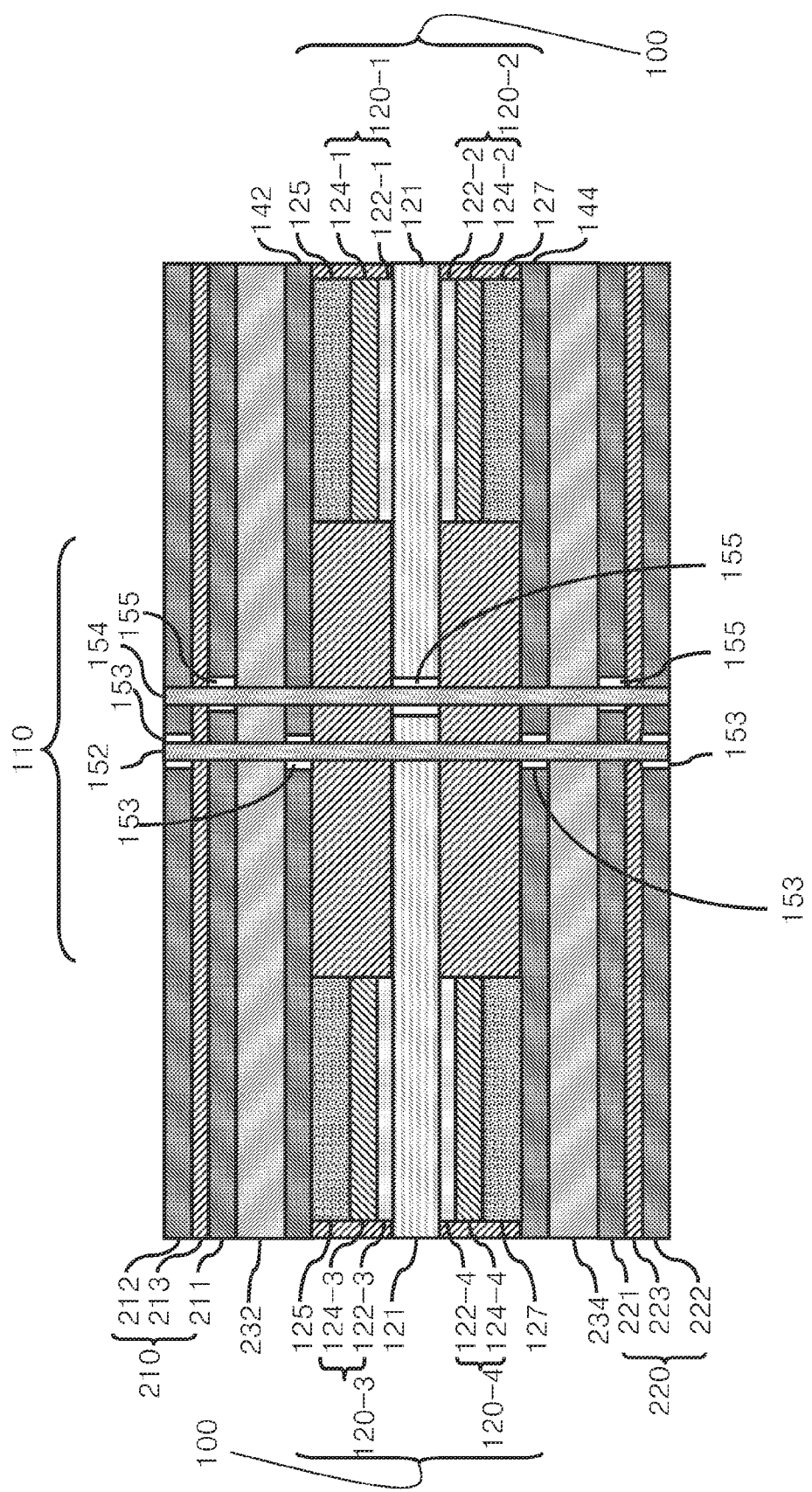
FIG. 5 is a schematic structural view of the embedded capacitor module according to another embodiment of the disclosure.

FIG. 5 is a schematic structural view of the embedded capacitor module according to another embodiment of the disclosure. As shown in FIG. 5, the embedded capacitor module 100 is connected in parallel to a planar capacitor 210 and/or a planar capacitor 220. The planar capacitor 210 is formed on one surface of the embedded capacitor module 100, and the planar capacitor 220 is formed on the other surface of the embedded capacitor module 100. The planar capacitor 210 is bonded with the embedded capacitor module 100 through a bonding layer 232. The planar capacitor 220 is also bonded with the embedded capacitor module 100 through a bonding layer 234. The bonding layers are made of an insulating material. The planar capacitor 210 comprises a first metal layer 211, a second metal layer 212 and an insulating layer 213 formed between the first metal layer 211 and the second metal layer 212. The planar capacitor 220 comprises a first metal layer 221, a second metal layer 222 and an insulating layer 223 formed between the first metal layer 221 and the second metal layer 222. The first via 152 and the second via 154 are formed in the electrode lead-out region 110. The first via 152 connects the metal substrate 121 of the solid electrolytic capacitor, the first metal layer 211 of the planar capacitor 210 and the first metal layer 221 of the planar capacitor 220. The second via 154 connects the upper substrate 142 and the lower substrate 144 of the embedded capacitor module 100, the second metal layer 212 of the planar capacitor 210, and the second metal layer 222 of the planar capacitor 220. By the design of the first via 152 and the second via 154 and the connection relations thereof, the embedded capacitor module 100 and the planar capacitors 210, 220 are electrically connected in parallel.

In this embodiment, since the polarities of the first via and the second via are opposite, and the first via 152 connects the metal substrate 121 of the solid electrolytic capacitor, the first metal layer 211 of the planar capacitor 210 and the first metal layer 221 of the planar capacitor 220, the second via 154 is electrically insulated from the metal substrate 121, the first metal layer 211 and the first metal layer 221. Likewise, the second via 154 connects the upper substrate 142 and the lower substrate 144 of the embedded capacitor module 100, the second metal layer 212 of the planar capacitor 210 and the second metal layer 222 of the planar capacitor 220; and the first via 152 is electrically insulated from the metal layers 142, 144, 212 and 222. As shown in the figure, an insulating material 153 is formed around the first via 152 penetrating the upper substrate 142 and the lower substrate 144 of the embedded capacitor module 100, the second metal layer 212 of the planar capacitor 210 and the second metal layer 222 of the planar capacitor 220, and also an insulating material 155 is formed around the second via 154 penetrating the metal substrate 121 of the solid electrolytic capacitor, the first metal layer 211 of the planar capacitor 210 and the first metal layer 221 of the planar capacitor 220. In one embodiment, the metal substrate 121 is formed to have scraggy surfaces by way of, but not limited to, etching process to increase the surface area of the metal substrate 121.

It can be seen from FIG. 5 that, in addition to the solid electrolytic capacitor of the embedded capacitor module 100, two sets of the planar capacitors are provided, so that the solid electrolytic capacitor module may provide several nF to hundreds of uF capacitance at the same time. The capacitor module in the embodiment of FIG. 5 may suppress both the high-frequency and low-frequency noises. Definitely, the number of the solid electrolytic capacitor, the number of the planar capacitor and the positions of the first via and the second via in the embedded capacitor module 100 are not fixed, and can be changed according to actual circuit design or system requirements. That is, the planar capacitor may be designed as one layer, and in this case, the position of the insulating layer around the first via 152 and the second via 154 is adjusted accordingly.

In other embodiments, the insulating material of the planar capacitor may be fabricated or ink-jet printed with a high dielectric constant.

Figure 6:
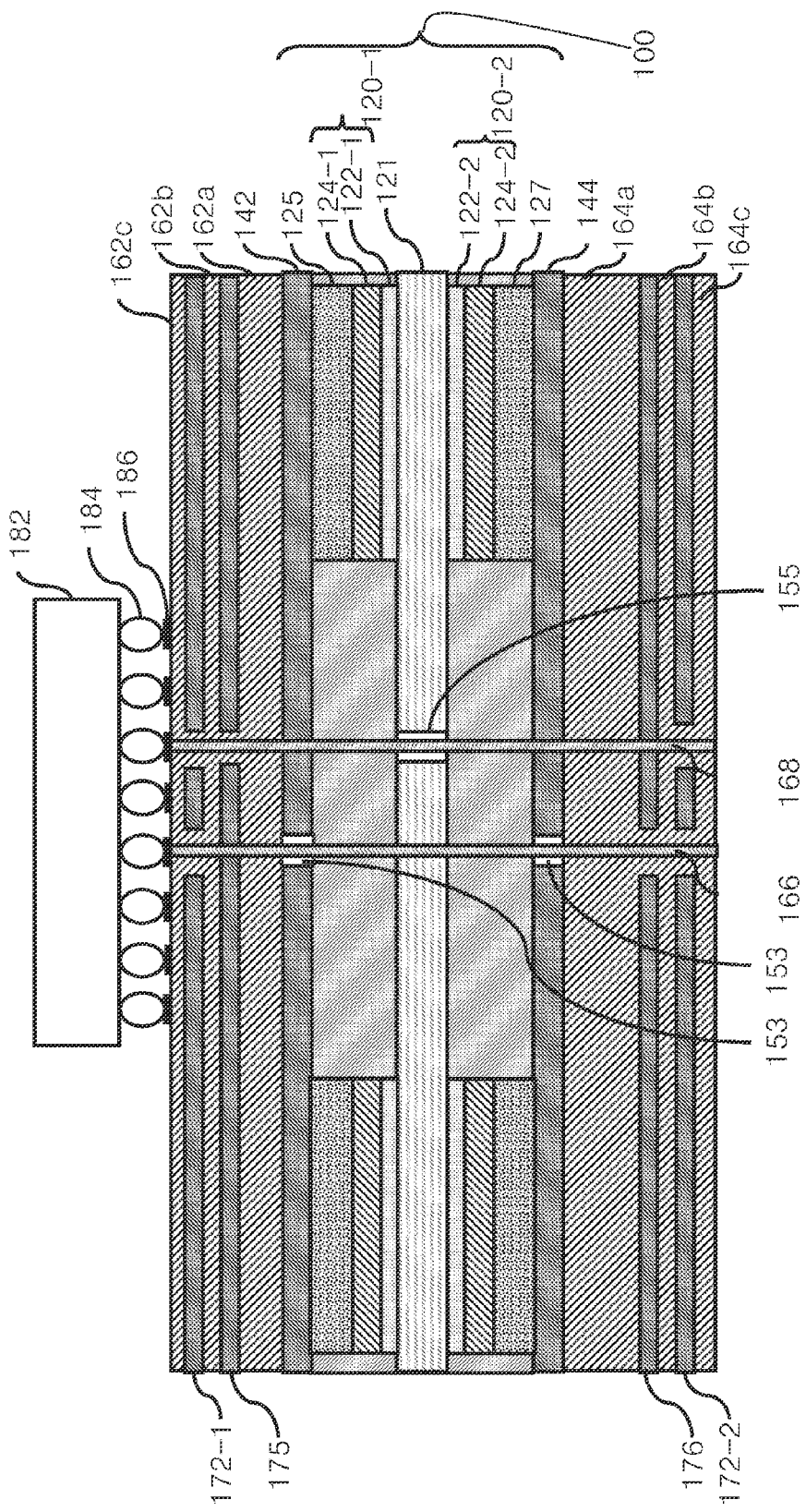
FIG. 6 is a schematic structural view of the embedded capacitor module according to another embodiment of the disclosure.

FIG. 6 illustrates an application of the embedded capacitor module in FIG. 5. As shown in FIG. 6, an embedded capacitor module 100 is formed in an IC carrier board, insulating layers 162a, 162b, 162c, 164a, 164b and 164c are respectively formed on upper and lower surfaces of the embedded capacitor module 100, and the embedded capacitor module is built in the IC carrier board. The IC carrier board also has signal layers 172-1, 172-2, a power layer 175 and a grounding layer 176, which are respectively formed in the insulating layers 162a, 162b, 162c, 164a, 164b and 164c. During manufacture process, the insulating layer 162a is formed on the upper surface of the module 100. Then the power layer 175, the insulating layer 162b, the signal layer 172-1, and the insulating layer 162c are sequentially formed. Similarly, the insulating layer 164a is formed on the lower surface of the module 100. Then the grounding layer 176, the insulating layer 164b, the signal layer 172-2, and the insulating layer 164c are sequentially formed. Although the layers are collectively named as the insulating layers 162a, 162b, 162c, 164a, 164b and 164c, those skilled in the art should understand that the insulating layers 162a, 162b, 162c, 164a, 164b and 164c, the signal layer 172, the power layer 175 and the grounding layer 176 are formed layer by layer. An IC 182 is electrically connected to the IC carrier board by solder balls 184 and pads 186, that is, at least one of the solder balls of the IC 182 is electrically connected to the grounding layer 176 of the IC carrier board, and at least another solder ball is electrically connected to the power layer 175 of the IC carrier board. The signal layers 172-1, 172-2 of the IC carrier board are used for transmitting signals. Likewise, the first via 166 connects the metal substrate 121 of the solid electrolytic capacitor and the power layer 175 of the IC carrier board, and the second via 168 connects the upper substrate 142 and the lower substrate 144 of the embedded capacitor module 100 and the grounding layer 176 of the IC carrier board. This architecture provides the capacitance required by the IC on the surface of the IC carrier board.

Similar to the above embodiments, an insulating material 153 is formed around the first via 166 penetrating the upper substrate 142 and the lower substrate 144, and an insulating material 155 is formed around the second via 168 penetrating the metal substrate 121.

The disclosure provides the large-area and high-capacitance embedded capacitor module, which may be embedded in the printed circuit board and may also be connected in parallel to the embedded planar capacitor of the organic substrate. This capacitor module may provide several nF to hundreds of uF capacitance to solve the problem that the capacitance of the current embedded planar capacitor of the printed circuit board cannot exceed uF. The substrate embedded capacitor module may be applied in the printed circuit board and the chip carrier board, and provide a decoupling capacitor or a bypass capacitor having a large capacitance, wide frequency band and low impedance, thereby achieving the purpose of stabilizing the power system of the IC.

The embedded capacitor module according to the embodiment of the disclosure is in having a large capacitance as the conventional solid capacitor, but also capable of being drilled or plated and electrically connected to other circuits after being embedded in a printed circuit board.

According to the embodiment of the disclosure, the circuit having the capacitance above 100 uF may be provided in the printed circuit board. Moreover, an ultra-thin planar capacitor made of an organic dielectric material may be connected in parallel in the embodiment of the disclosure, and further, the circuit having the capacitance of tens of nF to hundreds of uF may be provided in the printed circuit board, thereby providing the effect of suppressing both the low-frequency-band and high-frequency-band power noises.

In another embodiment, the embedded capacitor module comprises an electrode lead-out portion and at least one solid electrolytic capacitor portion adjacently disposed with the electrode lead-out portion. The electrode lead-out portion comprises a first substrate, a second substrate, a first insulating material disposed between the first substrate and the second substrate, a first porous layer formed on at least one surface of the first substrate, and a first oxide layer disposed on the first porous layer. The solid electrolytic capacitor portion comprises the first substrate extended from the electrode lead-out portion, the second substrate extended from the electrode lead-out portion, the first porous layer extended from the electrode lead-out portion and formed on at least one surface of the first substrate extended from the electrode lead-out portion, the first oxide layer extended from the electrode lead-out portion and disposed on the first porous layer extended from the electrode lead-out portion, a first conductive polymer layer disposed on the first oxide layer, a first carbon layer disposed on the first conductive polymer layer, and a first conductive adhesive layer disposed on the first carbon layer, wherein the first conductive adhesive layer is electrically connected to the second substrate and the first carbon layer, and the first insulating material contacts with at least one side of the first conductive polymer layer, the first carbon layer and the first conductive adhesive layer. The various detailed embodiments are given below.

FIG. 7A and FIG. 7B are cross-section structural and top views of an embedded capacitor module 200 according to another embodiment of the disclosure.

As shown in FIG. 7A and FIG. 7B, the embedded capacitor module 200 comprises electrode lead-out portions 210 and a solid electrolytic capacitor portion 230 adjacently disposed with the electrode lead-out portions 210. In the figures, the solid electrolytic capacitor portion 230 is formed between the two electrode lead-out portions 210. The electrode lead-out portion 210 comprises a first substrate 221, a second substrate 222, a first insulating material 241 disposed between the first substrate 221 and the second substrate 222, a first porous layer 251 and a second porous layer 252 respectively formed on the two surfaces of the first substrate 221, a first oxide layer 253 disposed on the first porous layer 251, and a second oxide layer 254 disposed on the second porous layer 252.

The solid electrolytic capacitor portion 230 comprises the first substrate 221 extended from the electrode lead-out portion 210, the second substrate 222 extended from the electrode lead-out portion 210, the first porous layer 251 and the second porous layer 252 extended from the electrode lead-out portion 210 and respectively formed on the two surfaces of the first substrate 221 extended from the electrode lead-out portion 210, the first oxide layer 253 and the second oxide layer 254 extended from the electrode lead-out portion 210 and disposed on the first porous layer 251 and the second porous layer 252 respectively extended from the electrode lead-out portion 210, a first conductive polymer layer 271 disposed on the first oxide layer 253, a first carbon layer 272 disposed on the first conductive polymer layer 271, and a first conductive adhesive layer 273 disposed on the first carbon layer 272. The first conductive adhesive layer 273 is electrically connected to the second substrate 222 and the first carbon layer 272. As the solid electrolytic capacitor portion 230 is formed between the two electrode lead-out portions 210, the first insulating material 241 contacts with two sides of the first conductive polymer layer 271, the first carbon layer 272, and the first conductive adhesive layer 273.

In one embodiment, the material of the first substrate 221 is generally, but not limited to, aluminum. The material of the second substrate 222 may be conductive material, which is but not limited to, copper, silver or the like. The material of the first conductive polymer layer 271 may be, but not limited to, poly(3,4-ethylenedioxythiophene) (PEDOT). The material of the first conductive adhesive layer 273 may be, but not limited to, silver or other conductive material. The first oxide layer 253 and the second oxide layer 254 are metal oxide layers.

In one embodiment, the first substrate 221 serves as a first electrode of the embedded capacitor module, and the second substrate 222 serves as a second electrode of the embedded capacitor module. The polarities of the first electrode and the second electrode are opposite to each other.

In one embodiment, the embedded capacitor module 200 further comprises a first via 261 and a second via 262. The first via 261, formed in the electrode lead-out portion 210, is electrically connected to the first substrate 221 and electrically isolated from the second substrate 222. The second via 262, formed in the electrode lead-out portion 210, is electrically connected to the second substrate 222 and electrically isolated from the first substrate 221.

In one embodiment, the embedded capacitor module 200 further comprises a first electrode pad 263 disposed on the first insulating material 241 and a first pad insulating material 242 disposed around the first electrode pad 263 in the electrode lead-out portion 210.

A via insulating material 243 disposed around the second via 262 penetrating the first substrate 221. The first electrode pad 263 is electrically connected to the first via 261 and the first substrate 221, and electrically isolated from the second substrate 222.

FIG. 8A and FIG. 8B are cross-section structural and top views of an embedded capacitor module 200 according to another embodiment of the disclosure.

In this embodiment, most of the components having the same reference numbers are have similar or the same composition or operation as those in the embodiment of FIG. 7A and FIG. 7B. The difference lies in the first via. In FIG. 7A and FIG. 7B, the first via 261 is a through via, which penetrates the first substrate 221, while the first via 264 in this embodiment is a blind via, which does not penetrate the first substrate 221. The first via 264 is electrically connected to the first substrate 221 and the first electrode pad 263 and electrically isolated from the second substrate 222.

Figure 9A:
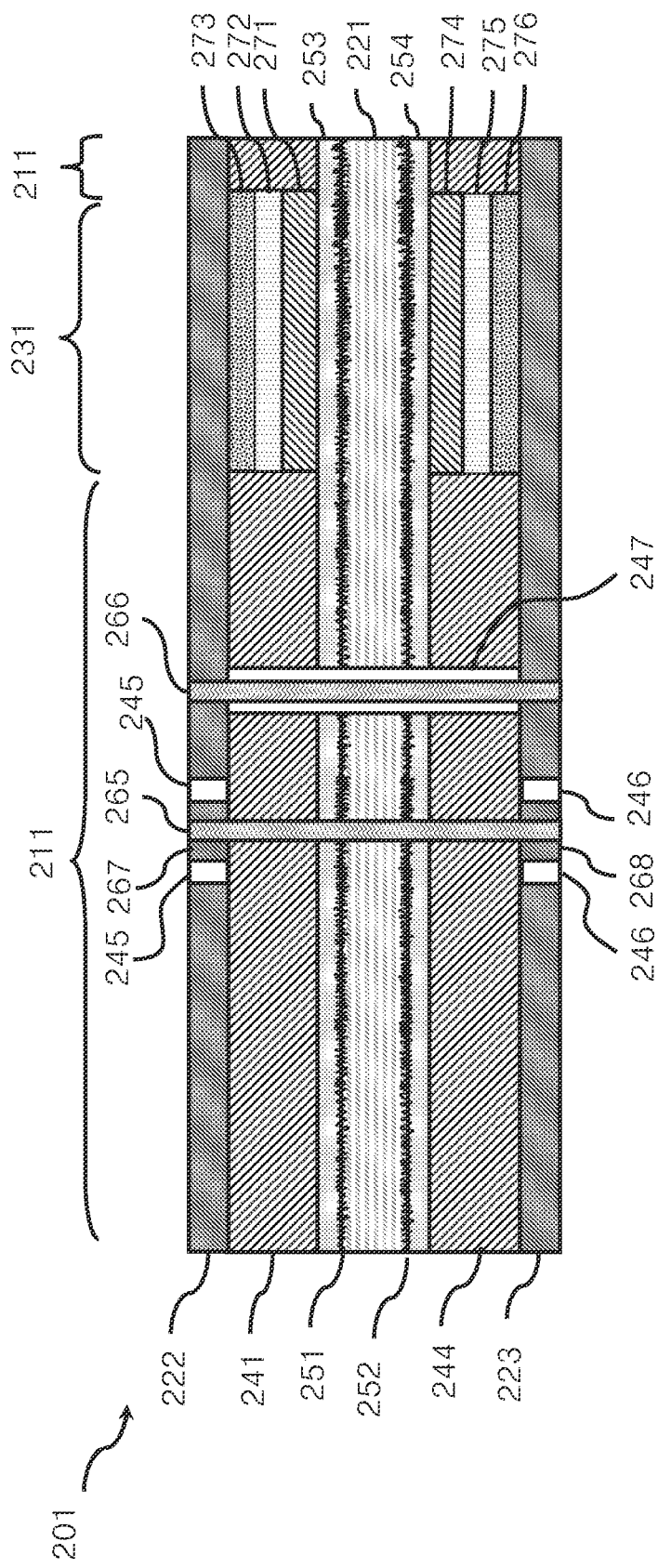
FIG. 9A and FIG. 9B are cross-section structural and top views of an embedded capacitor module according to another embodiment of the disclosure.
Figure 9B:
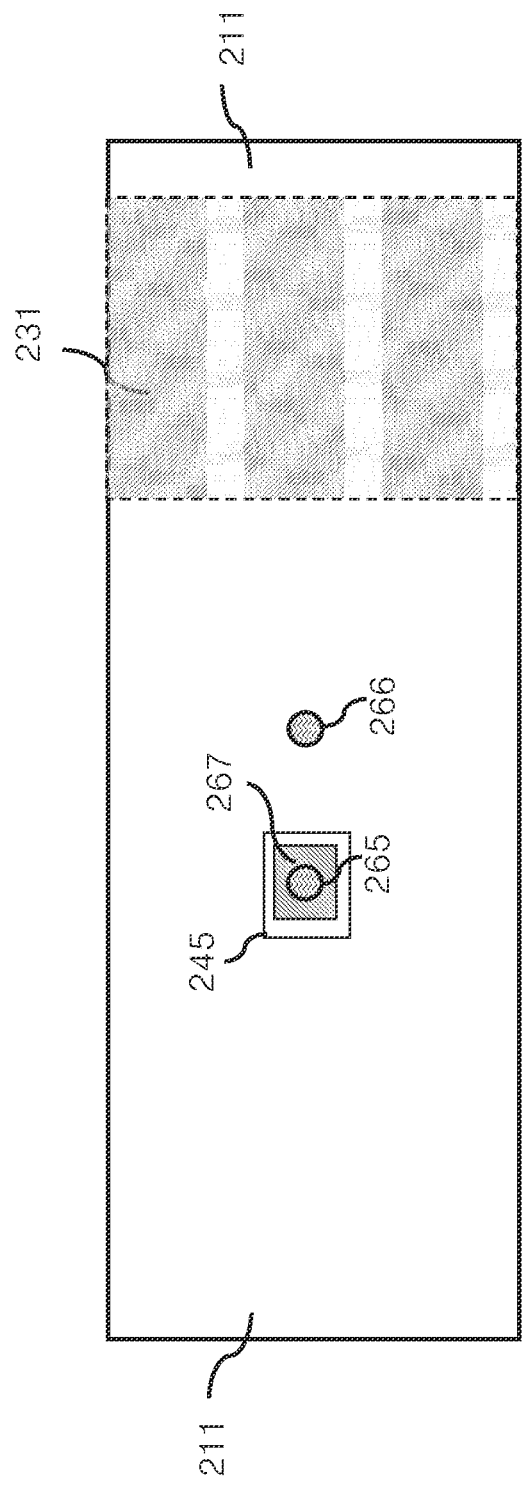

FIG. 9A and FIG. 9B are cross-section structural and top views of an embedded capacitor module 201 according to another embodiment of the disclosure.

The embedded capacitor module 201 comprises electrode lead-out portions 211 and a solid electrolytic capacitor portion 231 adjacently disposed with the electrode lead-out portions 211. In the figures, the solid electrolytic capacitor portion 231 is formed between the two electrode lead-out portions 211. The electrode lead-out portion 211 comprises a first substrate 221, a second substrate 222, a first insulating material 241 disposed between the first substrate 221 and the second substrate 222, a first porous layer 251 and a second porous layer 252 formed on the two surfaces of the first substrate 221 respectively, and a first oxide layer 253 disposed on the first porous layer 251 and a second oxide layer 254 disposed on the second porous layer 252. The electrode lead-out portion 211 further comprises a third substrate 223 and a second insulating material 244 disposed between the first substrate 221. The solid electrolytic capacitor portion 231 further comprises the third substrate 223 extended from the electrode lead-out portion 211.

The solid electrolytic capacitor portion 231 comprises the first substrate 221 extended from the electrode lead-out portion 211, the second substrate 222 extended from the electrode lead-out portion 211, the first porous layer 251 and the second porous layer 252 extended from the electrode lead-out portion 211 and respectively formed on the two surfaces of the first substrate 221 extended from the electrode lead-out portion 211, and the first oxide layer 253 and the second oxide layer 254 extended from the electrode lead-out portion 211 and respectively disposed on the first porous layer 251 and the second porous layer 252 extended from the electrode lead-out portion 211, a first conductive polymer layer 271 disposed on the first oxide layer 253, a first carbon layer 272 disposed on the first conductive polymer layer 271, and a first conductive adhesive layer 273 disposed on the first carbon layer 272. The first conductive adhesive layer 273 is electrically connected to the second substrate 222 and the first carbon layer 272. The first insulating material 241 contacts with the two sides of the first conductive polymer layer 271, the first carbon layer 272 and the first conductive adhesive layer 273. The solid electrolytic capacitor portion 231 further comprises a second conductive polymer layer 274 disposed on the second oxide layer 254, a second carbon layer 275 disposed on the second conductive polymer layer 274, and a second conductive adhesive layer 276 disposed on the second carbon layer 275. The second conductive adhesive layer 276 is electrically connected to the third substrate 223 and the second carbon layer 275. The second insulating material 244 contacts with two sides of the second conductive polymer layer 274, the second carbon layer 275, and the second conductive adhesive layer 276.

In one embodiment, the material of the first substrate 221 is generally, but is not limited to, aluminum. The material of the second substrate 222 and the third substrate 223 may be conductive material, which is but is not limited to, copper, silver or the like. The material of the first conductive polymer layer 271 and the second conductive polymer layer 274 may be, but is not limited to, poly(3,4-ethylenedioxythiophene) (PEDOT). The material of the first conductive adhesive layer 273 and the second conductive adhesive layer 276 may be, but is not limited to, silver or other conductive material. The first oxide layer 253 and the second oxide layer 254 are metal oxide layers.

In one embodiment, the embedded capacitor module 201 further comprises a first via 265 and a second via 266. The first via 265, formed in the electrode lead-out region 211, is electrically connected to the first substrate 221 and electrically isolated from the second substrate 222 and the third substrate 223. The second via 266, formed in the electrode lead-out region 211, is electrically connected to the second substrate 222 and the third substrate 223 and electrically isolated from the first substrate 221. In this case, the first substrate 221 serves as a first electrode, and the second substrate 222 and the third substrate 223 serves as a second electrode. The polarities of the first electrode and the second electrode are opposite to each other.

In one embodiment, the embedded capacitor module 201 further comprises a first electrode pad 267 disposed on the first insulating material 241, a first pad insulating material 245 disposed around the first electrode pad 267, a second electrode pad 268 disposed on the second insulating material 244, a second pad insulating material 246 disposed around the second electrode pad 268, and a via insulating material 247 disposed around the second via 266 penetrating the first substrate 221 in the electrode lead-out portion 211. The first electrode pad 267 and the second electrode pad 268 are electrically connected to the first via 265, and electrically isolated from the second substrate 222 and the third substrate 223.

Figure 10A:
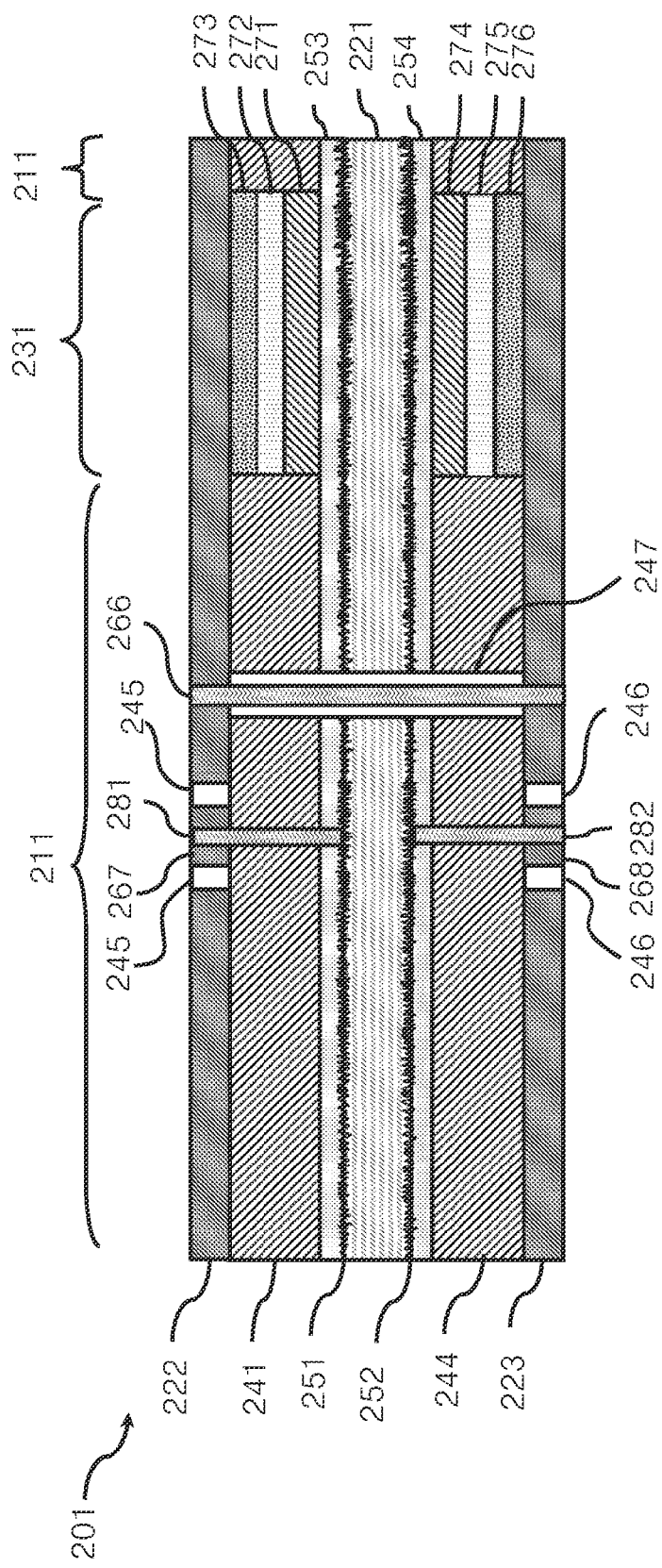
FIG. 10A and FIG. 10B are cross-section structural and top views of an embedded capacitor module according to another embodiment of the disclosure.
Figure 10B:
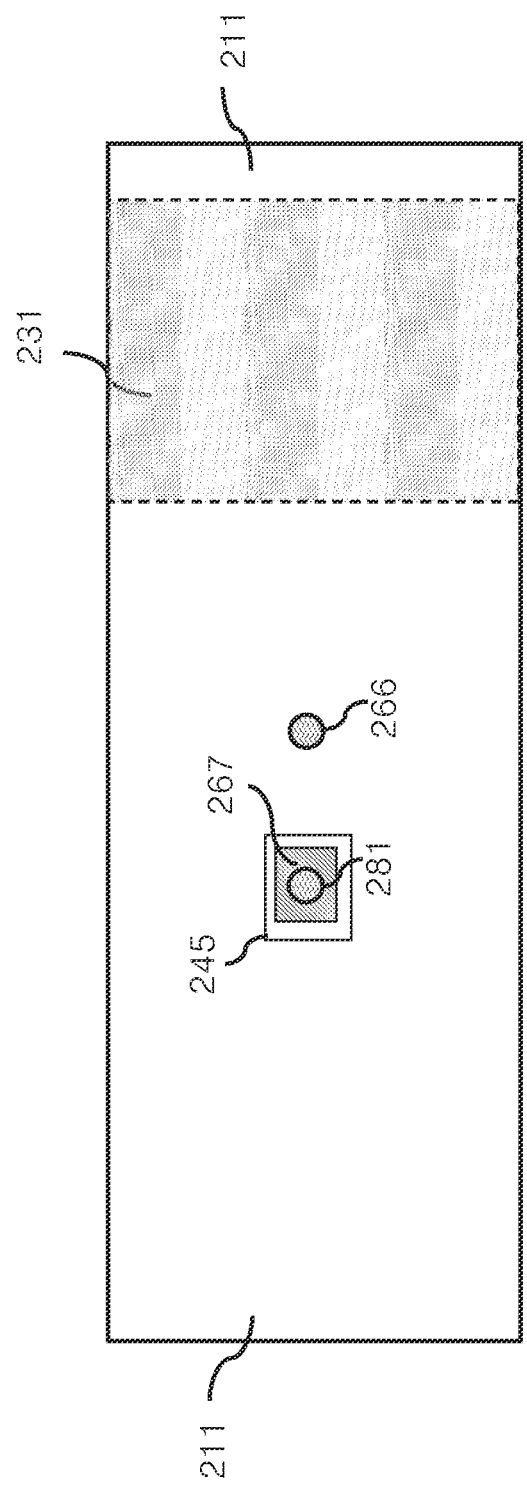

FIG. 10A and FIG. 10B are cross-section structural and top views of an embedded capacitor module 201 according to another embodiment of the disclosure.

In this embodiment, most of the components having the same reference numbers are have similar or the same composition or operation as those in the embodiment of FIG. 9A and FIG. 9B. The difference lies in the first via. In FIG. 9A and FIG. 9B, the first via 265 is a through via, which penetrates the first substrate 221, while the first via 281 is a blind via in FIG. 10A and FIG. 10B, which does not penetrate the first substrate 221. In this embodiment, the module further comprises a first via 281, a second via 266 and a third via 282. The first via 281 and the third via 282 are blind vias. The first via 281 is electrically connected to the first substrate 221 and the first electrode pad 267. The third via 282 is electrically connected to the first substrate 221 and the second electrode pad 268. The second via 266 is electrically connected to the second substrate 222 and the third substrate 223, and electrically isolated from the first substrate 221.

In the embodiment, the central axis of the first via 281 aligns with that of the third via 282 as shown in FIG. 10A and FIG. 10B. In another embodiment, the central axis of the first via 281 does not align with that of the third via 282.

Figure 11A:
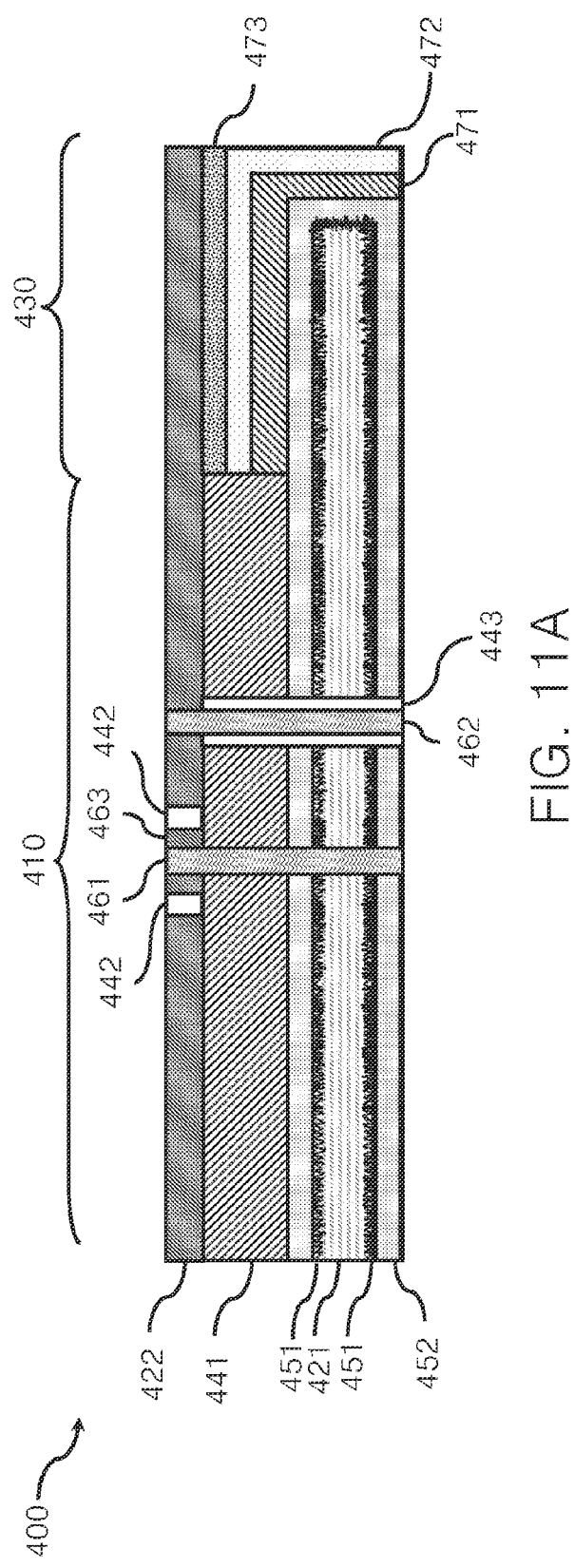
FIG. 11A and FIG. 11B are cross-section structural and top views of an embedded capacitor module according to another embodiment of the disclosure.
Figure 11B:
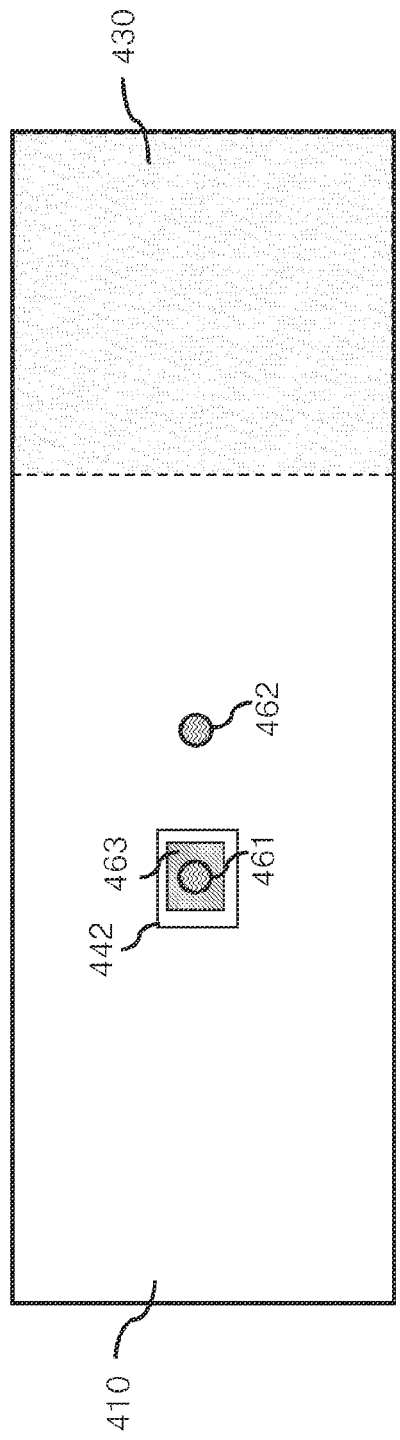

FIG. 11A and FIG. 11B are cross-section structural and top views of an embedded capacitor module 400 according to another embodiment of the disclosure.

As shown in FIG. 11A and FIG. 11B, the embedded capacitor module 400 comprises an electrode lead-out portion 410 and a solid electrolytic capacitor portion 430 adjacently disposed with the electrode lead-out portion 410. The electrode lead-out portion 410 comprises a first substrate 421, a second substrate 422, a first insulating material 441 disposed between the first substrate 421 and the second substrate 422, a first porous layer 451 formed on at least one surface of the first substrate 421, and a first oxide layer 452 disposed on the first porous layer 451. In this embodiment, the first porous layer 451 is formed on at least three surfaces of the first substrate 421.

The solid electrolytic capacitor portion 430 comprises the first substrate 421 extended from the electrode lead-out portion 410, the second substrate 422 extended from the electrode lead-out portion 410, the first porous layer 451 extended from the electrode lead-out portion 410 and formed on at least one surface of the first substrate 421 extended from the electrode lead-out portion 410, the first oxide layer 452 extended from the electrode lead-out portion 410 and disposed on the first porous layer 451 extended from the electrode lead-out portion 410, a first conductive polymer layer 471 disposed on the first oxide layer 452, a first carbon layer 472 disposed on the first conductive polymer layer 471, and a first conductive adhesive layer 473 disposed on the first carbon layer 472. The first conductive adhesive layer 473 is electrically connected to the second substrate 422. The first insulating material 441 contacts with one side of the first conductive polymer layer 471, the first carbon layer 472 and the first conductive adhesive layer 473.

In one embodiment, the material of the first substrate 421 is generally, but is not limited to, aluminum. The material of the second substrate 422 may be conductive material, which is but is not limited to, copper, silver or the like. The material of the first conductive polymer layer 471 may be, but is not limited to, poly(3,4-ethylenedioxythiophene) (PEDOT). The material of the first conductive adhesive layer 473 may be, but is not limited to, silver or other conductive material. The first oxide layer 452 is a metal oxide layer.

In one embodiment, the embedded capacitor module 400 further comprises a first via 461 and a second via 462. The first via 461, formed in the electrode lead-out portion 410, is electrically connected to the first substrate 421 and electrically isolated from the second substrate 422. The second via 462, formed in the electrode lead-out portion 410, is electrically connected to the second substrate 422 and electrically isolated from the first substrate 421. In this case, the first substrate 421 serves as a first electrode, and the second substrate 422 serves as a second electrode. The polarities of the first electrode and the second electrode are opposite to each other.

In one embodiment, the embedded capacitor module 400 further comprises a first electrode pad 463 disposed on the first insulating material 441, a first pad insulating material 442 disposed around the first electrode pad 463, and a via insulating material 443 disposed around the second via 462 penetrating the first substrate 421 in the electrode lead-out portion 410. The first electrode pad 463 is electrically connected to the first via 461 and the first substrate 421 and electrically isolated from the second substrate 422.

FIG. 12A and FIG. 12B are cross-section structural and top views of an embedded capacitor module 400 according to another embodiment of the disclosure.

In this embodiment, most of the components having the same reference numbers are have similar or the same composition or operation as those in the embodiment of FIG. 11A and FIG. 11B. The difference lies in the first via. In FIG. 11A and FIG. 11B, the first via 461 is a through via, which penetrates the first substrate 421, while the first via 464 in this embodiment is a blind via, which does not penetrate the first substrate 421. The first via 464 is electrically connected to the first substrate 421 and the first electrode pad 463 and electrically isolated from the second substrate 422.

Figure 13A:
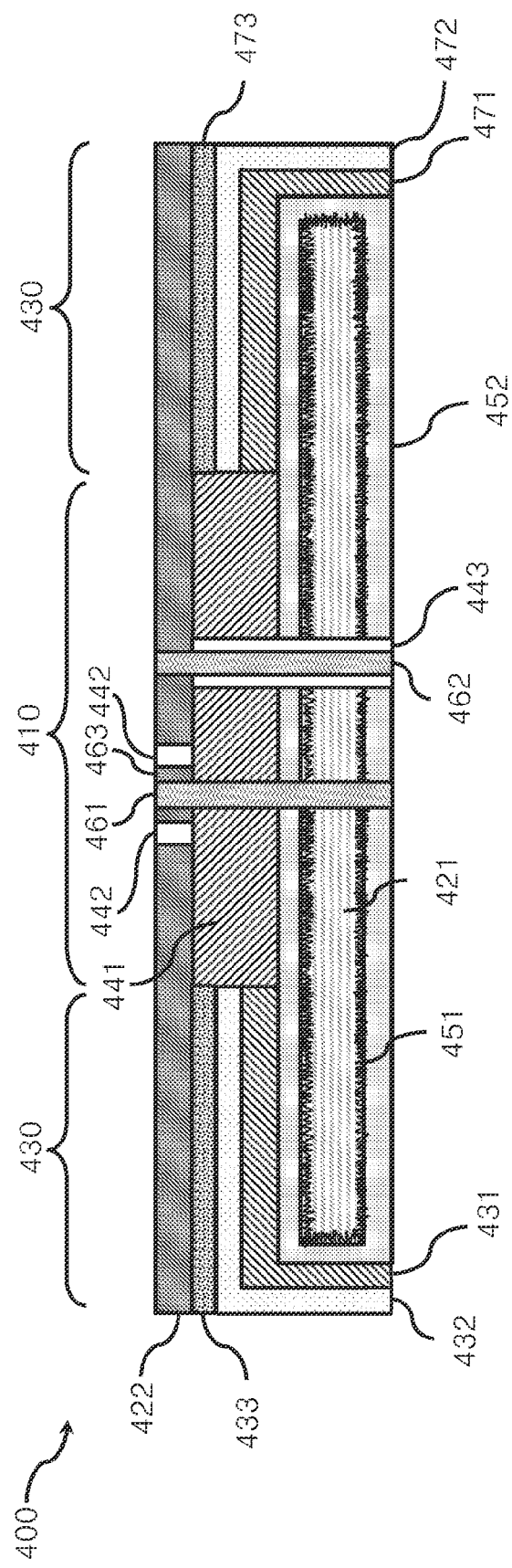
FIG. 13A and FIG. 13B are cross-section structural and top views of an embedded capacitor module according to another embodiment of the disclosure.
Figure 13B:
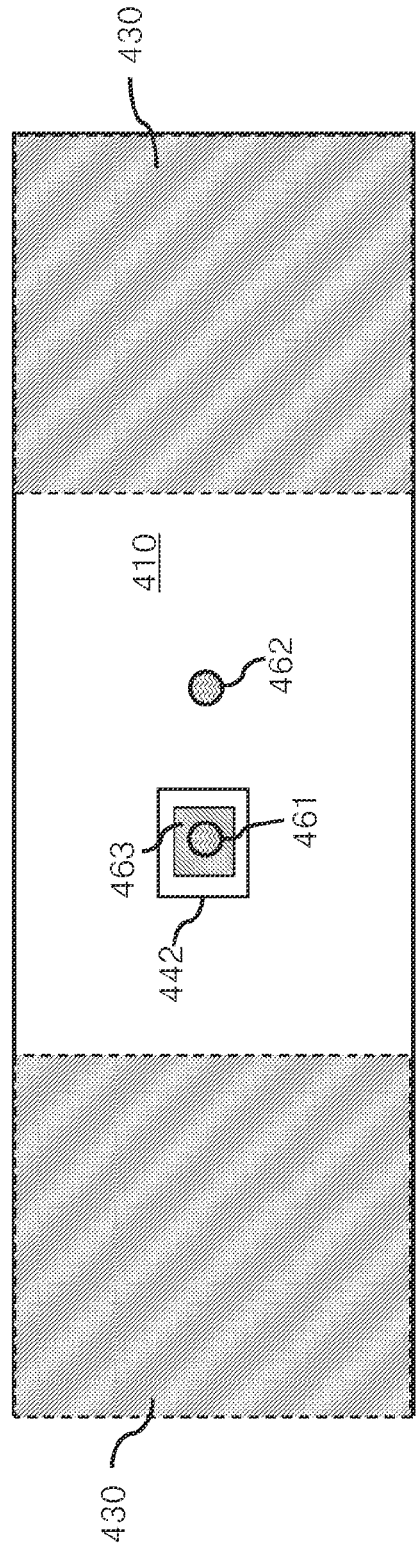

FIG. 13A and FIG. 13B are cross-section structural and top views of an embedded capacitor module 400 according to another embodiment of the disclosure.

In this embodiment, most of the components having the same reference numbers are have similar or the same composition or operation as those in the embodiment of FIG. 11A and FIG. 11B. In this embodiment, both of the solid electrolytic capacitor portions 430 are adjacently disposed with the electrode lead-out portion 410. In this embodiment, the first porous layer 451 is formed on all of the surfaces of the first substrate 421. The solid electrolytic capacitor portions 430 on the left side of the embedded capacitor module 400 is similar to the solid electrolytic capacitor portions 430 on the right side of the embedded capacitor module 400. The embedded capacitor module 400 further comprises a third conductive polymer layer 431 disposed on the first oxide layer 452, a third carbon layer 432 disposed on the third conductive polymer layer 431, and a third conductive adhesive layer 433 disposed on the third carbon layer 432. The third conductive adhesive layer 433 is electrically connected to the second substrate 422 and the third carbon layer 432.

FIG. 14A and FIG. 14B are cross-section structural and top views of an embedded capacitor module 401 according to another embodiment of the disclosure.

The embedded capacitor module 401 comprises an electrode lead-out portion 411 and a solid electrolytic capacitor portion 431 adjacently disposed with the electrode lead-out portion 411. The electrode lead-out portion 411 comprises a first substrate 421, a second substrate 422, a first insulating material 441 disposed between the first substrate 421 and the second substrate 422, a first porous layer 451 formed on at least one surface of the first substrate 421, and a first oxide layer 452 disposed on the first porous layer 451. The embedded capacitor module 401 further comprises a third substrate 423 and a second insulating material 444 disposed between the first substrate 421 and the third substrate 423 in the electrode lead-out portion 411 and the solid electrolytic capacitor portion 431. In this embodiment, the first porous layer 451 is formed on at least three surfaces of the first substrate 421.

The solid electrolytic capacitor portion 431 comprises the first substrate 421 extended from the electrode lead-out portion 411, the second substrate 422 extended from the electrode lead-out portion 411, the first porous layer 451 extended from the electrode lead-out portion 411 and formed on at least one surface of the first substrate 421 extended from the electrode lead-out portion 411, and the first oxide layer 452 extended from the electrode lead-out portion 411 and disposed on the first porous layer 451 extended from the electrode lead-out portion 411, a first conductive polymer layer 471 disposed on the first oxide layer 452, a first carbon layer 472 disposed on the first conductive polymer layer 471, and a first conductive adhesive layer 473 disposed on the first carbon layer 472. The first conductive adhesive layer 473 is electrically connected to the second substrate 422 and the first carbon layer 472. The first insulating material 441 contacts with one side of the first conductive polymer layer 471, the first carbon layer 472 and the first conductive adhesive layer 473.

In one embodiment, the material of the first substrate 421 is generally, but is not limited to, aluminum. The material of the second substrate 422 and the third substrate 423 may be conductive material, which is but is not limited to, copper, silver or the like. The material of the first conductive polymer layer 471 may be, but is not limited to, poly(3,4-ethylenedioxythiophene) (PEDOT). The material of the first conductive adhesive layer 473 may be, but is not limited to, silver or other conductive material. The first oxide layer 452 is a metal oxide layer.

In one embodiment, the embedded capacitor module 401 further comprises a first via 465 and a second via 466. The first via 465, formed in the electrode lead-out region 411, is electrically connected to the first substrate 421 and electrically isolated from the second substrate 422 and the third substrate 423. The second via 466, formed in the electrode lead-out region, is electrically connected to the second substrate 422 and the third substrate 423 and electrically isolated from the first substrate 421. In this case, the first substrate 421 serves as a first electrode, and the second substrate 422 and the third substrate 423 serves as a second electrode. The polarities of the first electrode and the second electrode are opposite to each other.

In one embodiment, the embedded capacitor module 401 further comprises a first electrode pad 467 disposed on the first insulating material 441, a first pad insulating material 445 disposed around the first electrode pad 467, a second electrode pad 468 disposed on the second insulating material 444, a second pad insulating material 446 disposed around the second electrode pad 468, and a via insulating material 447 disposed around the second via 466 penetrating the first substrate 421 in the electrode lead-out portion 411. The first electrode pad 467 and the second electrode pad 468 are electrically connected to the first via 465 and the first substrate 421, and electrically isolated from the second substrate 422 and the third substrate 423.

Figure 15A:
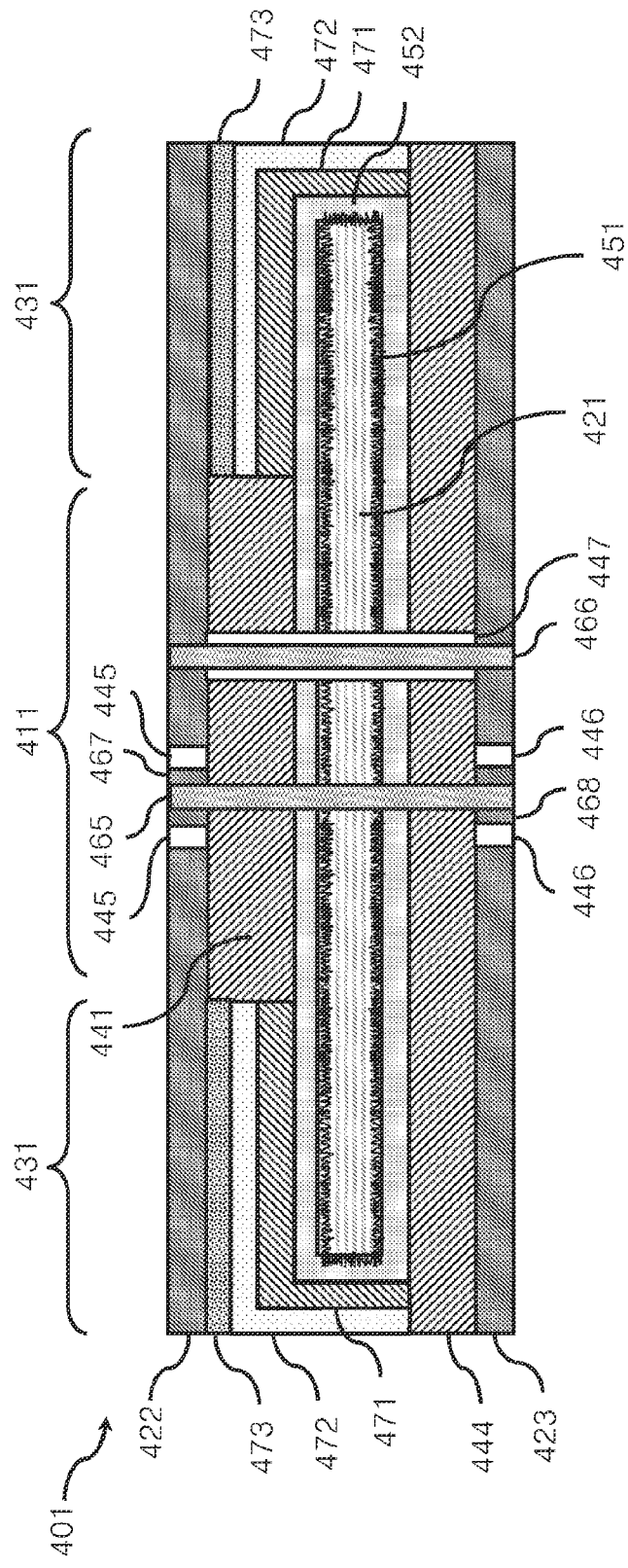
FIG. 15A and FIG. 15B are cross-section structural and top views of an embedded capacitor module according to another embodiment of the disclosure.
Figure 15B:
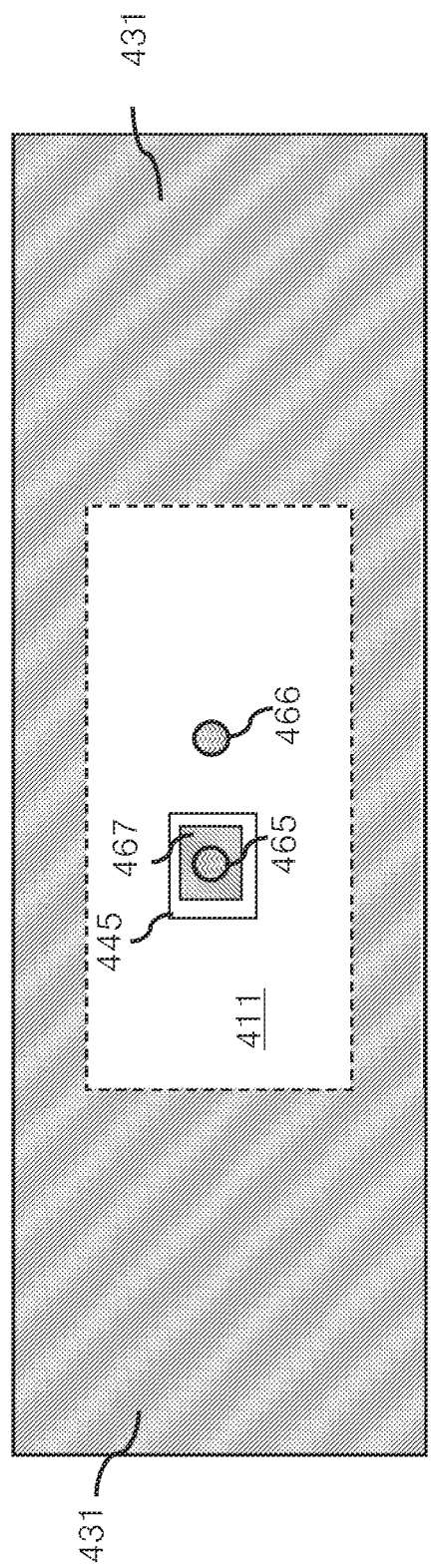

FIG. 15A and FIG. 15B are cross-section structural and top views of an embedded capacitor module 401 according to another embodiment of the disclosure.

In this embodiment, most of the components having the same reference numbers are have similar or the same composition or operation as those in the embodiment of FIG. 14A and FIG. 14B. In this embodiment, the solid electrolytic capacitor portion 431 surrounds and is adjacent to the electrode lead-out portion 411. In this embodiment, the first porous layer 451 is formed on all of the surfaces of the first substrate 421.

Figure 16A:
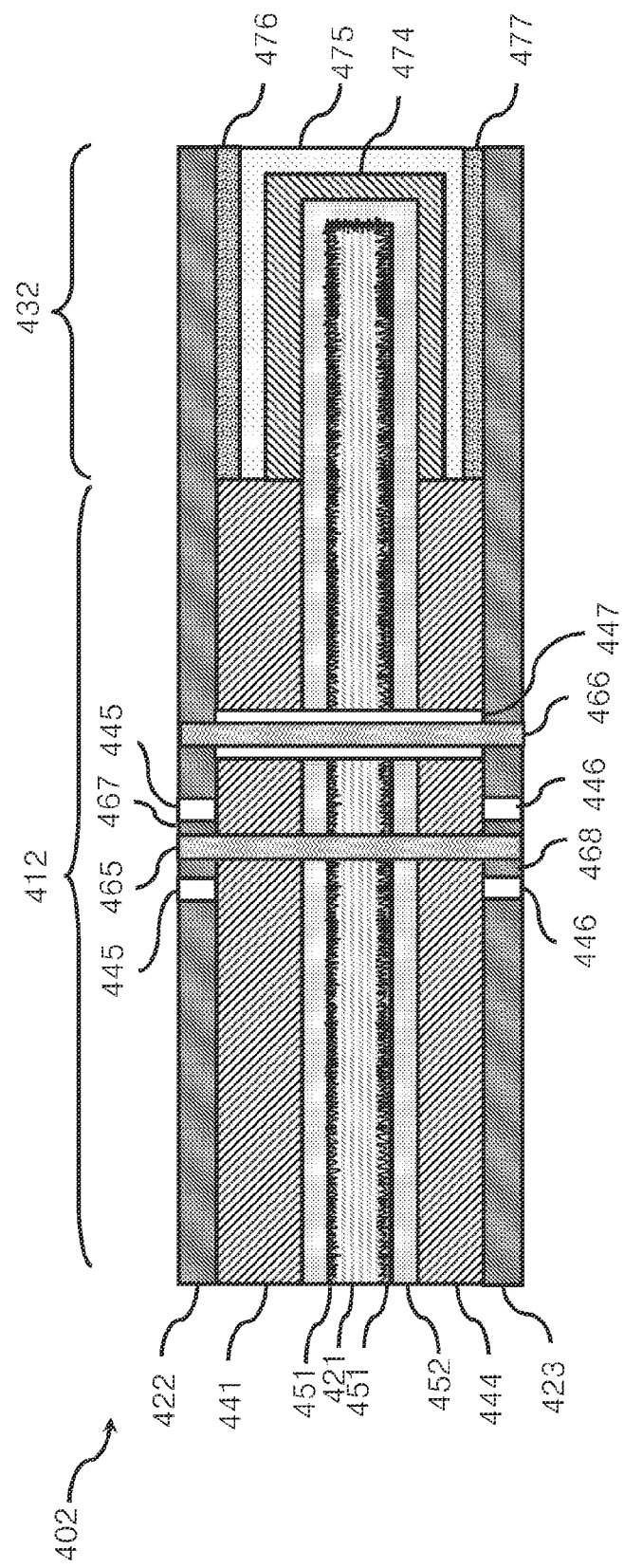
FIG. 16A and FIG. 16B are cross-section structural and top views of an embedded capacitor module according to another embodiment of the disclosure.
Figure 16B:
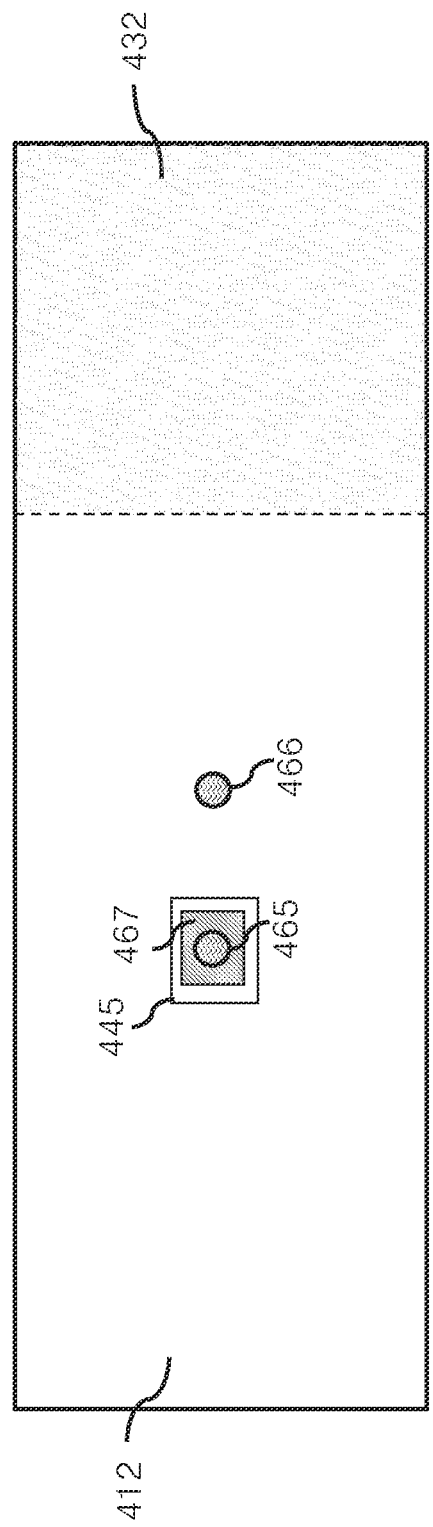

FIG. 16A and FIG. 16B are cross-section structural and top views of an embedded capacitor module 402 according to another embodiment of the disclosure.

As shown in FIG. 16A and FIG. 16B, the embedded capacitor module 402 comprises a electrode lead-out portion 412 and a solid electrolytic capacitor portion 432 adjacently disposed with the electrode lead-out portion 412. The electrode lead-out portion 412 comprises a first substrate 421, a second substrate 422, a first insulating material 441 disposed between the first substrate 421 and the second substrate 422, a first porous layer 451 formed on at least one surface of the first substrate 421, and a first oxide layer 452 disposed on the first porous layer 451. The electrode lead-out portion 412 further comprises a third substrate 423 and a second insulating material 444 disposed between the first substrate 421 and the third substrate 423. The solid electrolytic capacitor portion 432 further comprises the third substrate 423 extended from the electrode lead-out portion 412. In this embodiment, the first porous layer 451 is formed on at least three surfaces of the first substrate 421.

The solid electrolytic capacitor portion 432 comprises the first substrate 421 extended from the electrode lead-out portion 412, the second substrate 422 extended from the electrode lead-out portion 412, the first porous layer 451 extended from the electrode lead-out portion 412 and formed on at least one surface of the first substrate 421 extended from the electrode lead-out portion 412, and the first oxide layer 452 extended from the electrode lead-out portion 412 and disposed on the first porous layer 451 extended from the electrode lead-out portion 412, a first conductive polymer layer 474 disposed on the first oxide layer 452, and a first carbon layer 475 disposed on the first conductive polymer layer 474. The solid electrolytic capacitor portion 432 further comprises a first conductive adhesive layer 476 and a second conductive adhesive layer 477. The first conductive adhesive layer 476 disposed between the first carbon layer 475 and the second substrate 422, and the second conductive adhesive layer 477 disposed between the first carbon layer 475 and the third substrate 423. The first insulating material 441 contacts with one side of the first conductive polymer layer 474, the first carbon layer 475 and the first conductive adhesive layer 476. The second insulating material 444 contacts with one side of the first conductive polymer layer 474, the first carbon layer 475 and the second conductive adhesive layer 477.

The first conductive adhesive layer 476 is electrically connected to the second substrate 422 and the first carbon layer 475, and the second conductive adhesive layer 477 is electrically connected to the third substrate 423 and the first carbon layer 475.

In one embodiment, the material of the first substrate 421 is generally, but is not limited to, aluminum. The material of the second substrate 422 and the third substrate 423 may be conductive material, which is but is not limited to, copper, silver or the like. The material of the first conductive polymer layer 474 may be, but is not limited to, poly(3,4-ethylenedioxythiophene) (PEDOT). The material of the first conductive adhesive layer 476 and the second conductive adhesive layer 477 may be, but are not limited to, silver or other conductive material. The first oxide layer 452 is a metal oxide layer.

In one embodiment, the embedded capacitor module 402 further comprises a first via 465 and a second via 466. The first via 465, formed in the electrode lead-out region 412, is electrically connected to the first substrate 421 and electrically isolated from the second substrate 422 and the third substrate 423. The second via 466, formed in the electrode lead-out region 412, is electrically connected to the second substrate 422 and the third substrate 423 and electrically isolated from the first substrate 421. In this case, the first substrate 421 serves as a first electrode, and the second substrate 422 and the third substrate 423 serves as a second electrode. The polarities of the first electrode and the second electrode are opposite to each other.

In one embodiment, the embedded capacitor module 402 further comprises a first electrode pad 467 disposed on the first insulating material 441, a first pad insulating material 445 disposed around the first electrode pad 467, a second electrode pad 468 disposed on the second insulating material 444, a second pad insulating material 446 disposed around the second electrode pad 467, and a via insulating material 447 disposed around the second via 466 penetrating the first substrate 421 in the electrode lead-out portion 412. The first electrode pad 467 and the second electrode pad 468 are electrically connected to the first via 465 and electrically isolated from the second substrate 422 and the third substrate 423.

Figure 17A:
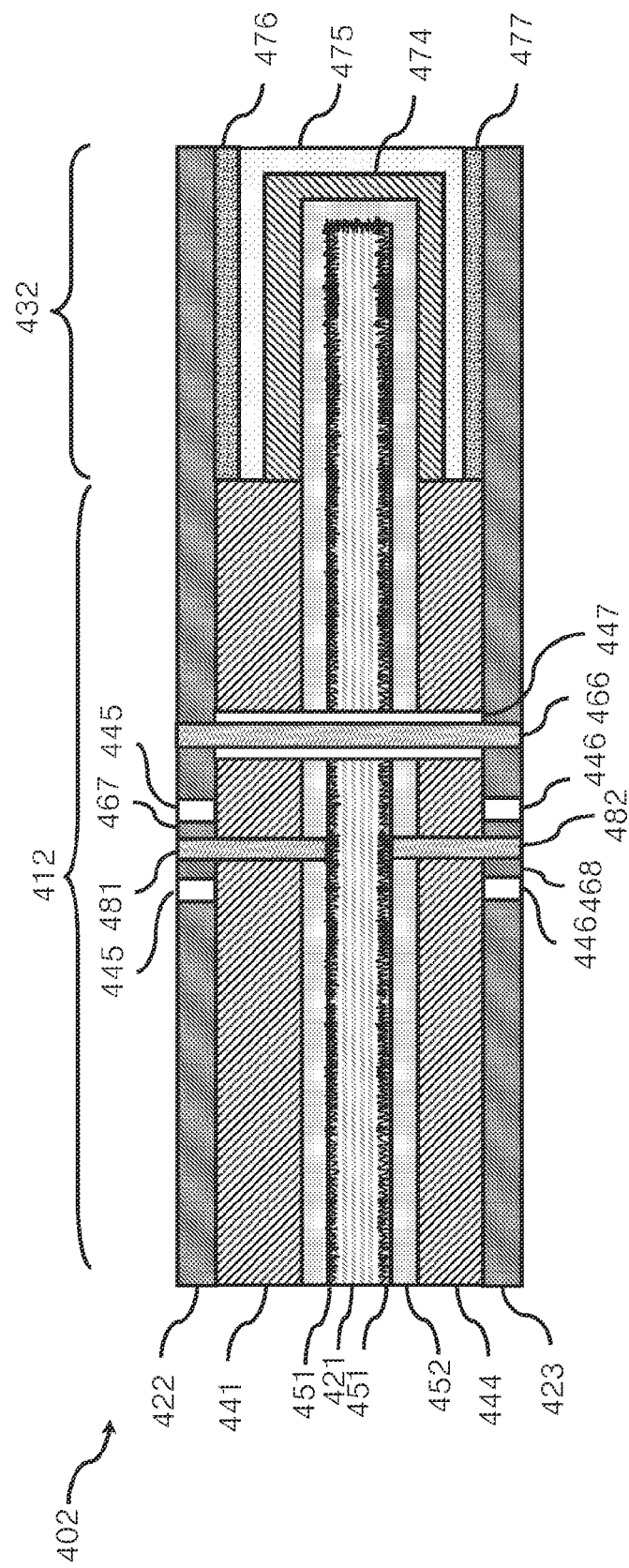
FIG. 17A and FIG. 17B are cross-section structural and top views of an embedded capacitor module according to another embodiment of the disclosure.
Figure 17B:
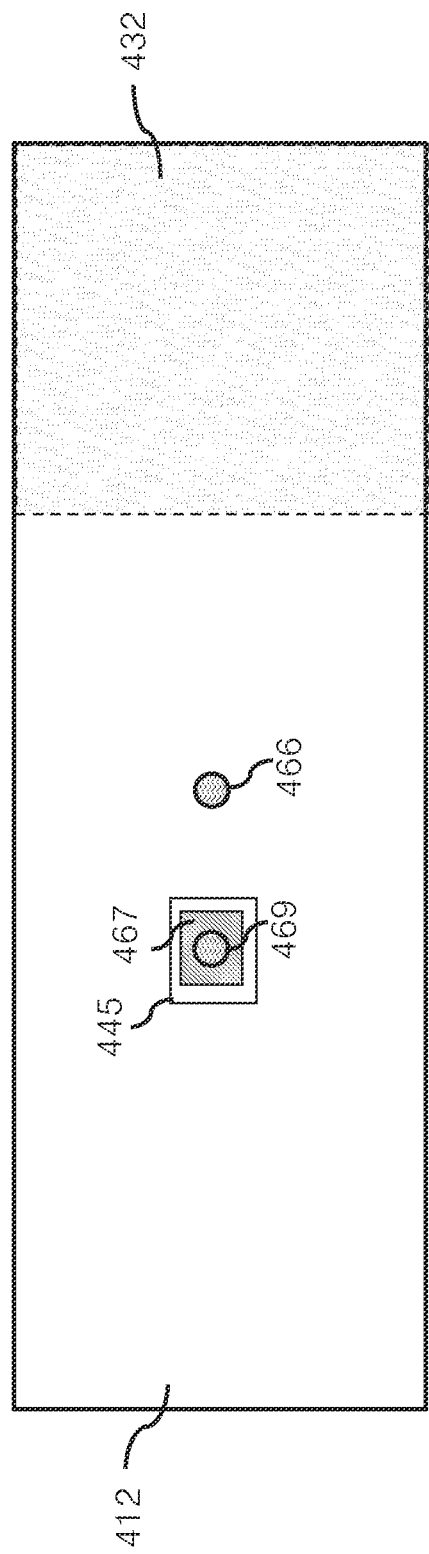

FIG. 17A and FIG. 17B are cross-section structural and top views of an embedded capacitor module 402 according to another embodiment of the disclosure.

In this embodiment, most of the components having the same reference numbers are have similar or the same composition or operation as those in the embodiment of FIG. 16A and FIG. 16B. The difference lies in the first via. In FIG. 16A and FIG. 16B, the first via 465 is a through via, which penetrates the first substrate 421, while the first via 481 is a blind via in FIG. 17A and FIG. 17B, which does not penetrate the first substrate 421. In this embodiment, the module further comprises a first via 481, a second via 466 and a third via 482. The first via 481 and the third via 482 are blind vias. The first via 481 is electrically connected to the first substrate 421 and the first electrode pad 467. The third via 482 is electrically connected to the first substrate 421 and the second electrode pad 468. The second via 466 is electrically connected to the second substrate 422 and the third substrate 423, and electrically isolated from the first substrate 421.

Figure 18A:
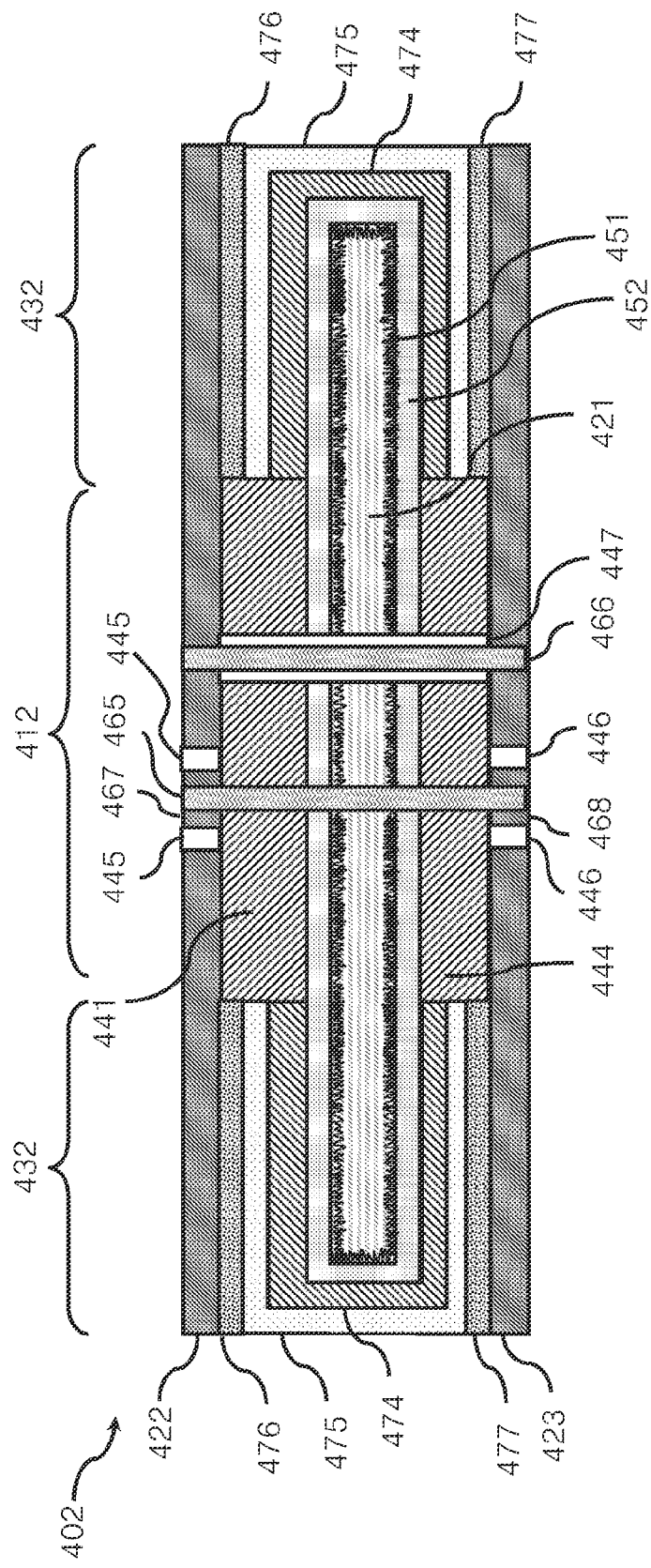
FIG. 18A and FIG. 18B are cross-section structural and top views of an embedded capacitor module according to another embodiment of the disclosure.
Figure 18B:
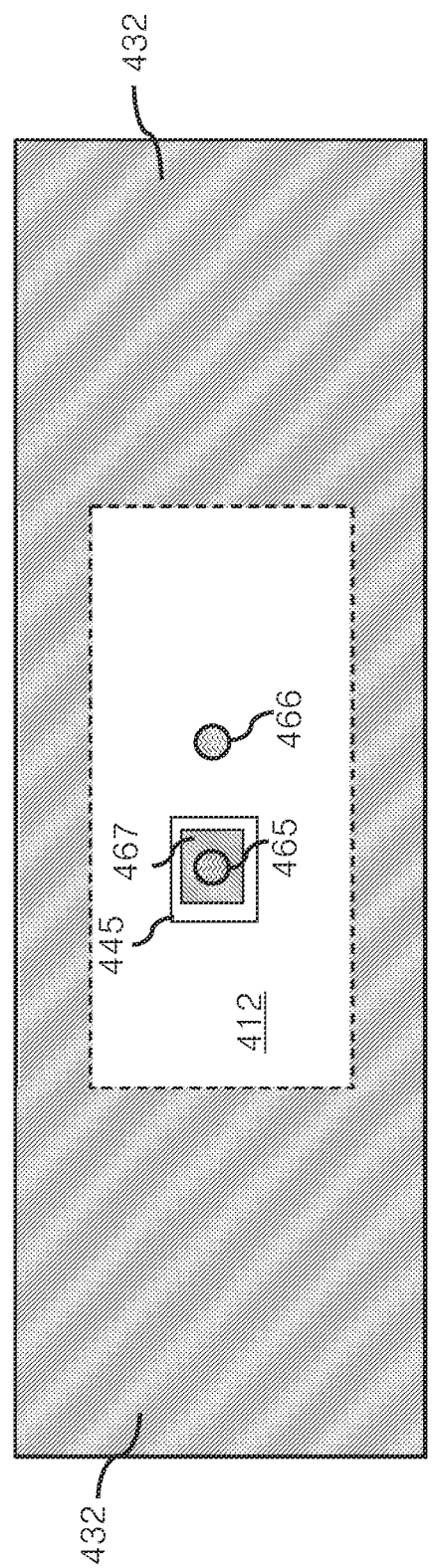

FIG. 18A and FIG. 18B are cross-section structural and top views of an embedded capacitor module 402 according to another embodiment of the disclosure.

In this embodiment, most of the components having the same reference numbers are have similar or the same composition or operation as those in the embodiment of FIG. 16A and FIG. 16B. In this embodiment, the solid electrolytic capacitor portion 432 surrounds and is adjacent to the electrode lead-out portion 412. In this embodiment, the first porous layer 451 is formed on all of the surfaces of the first substrate 421.

Figure 19:
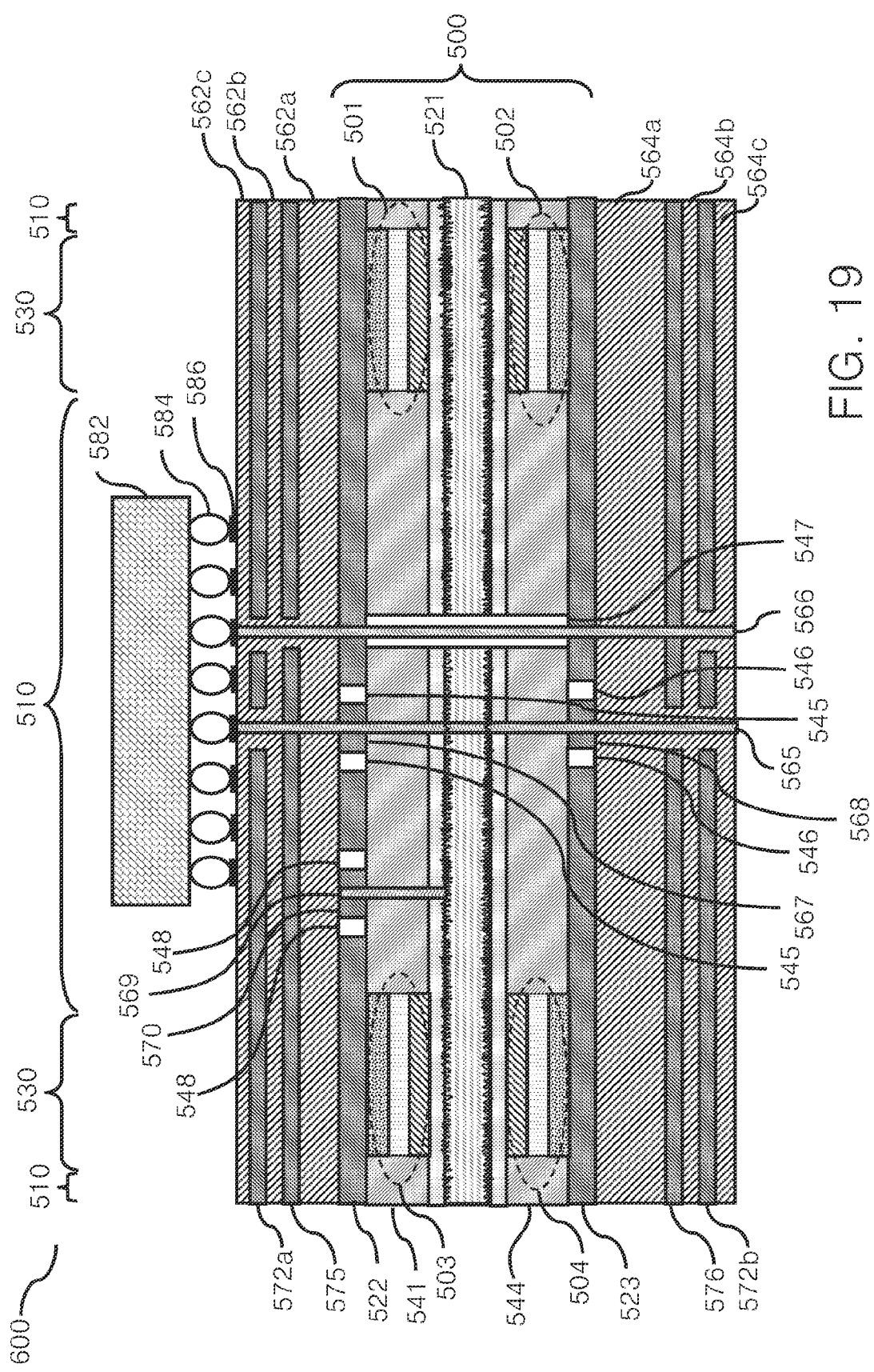
FIG. 19 is a cross-section structural and top view of the embedded capacitor module according to another embodiment of the disclosure.

FIG. 19 illustrates the cross-section structural view of a multilayer circuit board application of the embedded capacitor module of FIG. 9. The embedded capacitor module 500 comprises at least one electrode lead-out portion 510 and at least one solid electrolytic capacitor portion 530 adjacently disposed with the electrode lead-out portion 510. In this embodiment, the solid electrolytic capacitor portions 530 comprise solid electrolytic material 501, 502, 503 and 504. The top view and the arrangement of the solid electrolytic material 501, 502, 503 and 504 are similar as that in FIG. 22C. The formation method and the composition for the solid electrolytic material 501 and 503 are similar as that of the first conductive polymer layer 271, the first carbon layer 272, and the first conductive adhesive layer 273 of FIG. 9A. The formation method and the composition for the solid electrolytic material 502 and 504 are similar as that of the second conductive polymer layer 274, the second carbon layer 275 and the second conductive adhesive layer 276 of FIG. 9A. In this embodiment, the embedded capacitor module 500 further comprises a first electrode pad 567 disposed on the first insulating material 541, a first pad insulating material 545 disposed around the first electrode pad 567, a second electrode pad 568 disposed on the second insulating material 544, a second pad insulating material 546 disposed around the second electrode pad 568, and a via insulating material 547 disposed around the second via 566 penetrating the first substrate 521 in the electrode lead-out portion 510. The first electrode pad 567 and the second electrode pad 568 are electrically connected to the first via 565 and the first substrate 521 and electrically isolated from the second substrate 522 and the third substrate 523.

In this embodiment, the embedded capacitor module 500 further comprises at least one blind via 569, a third electrode pad 570 disposed on the first insulating material 541, and a third pad insulating material 548 disposed around the third electrode pad 570. The connection of the blind via 569 is similar as that of the first blind via 281 of FIG. 10A. The blind via 569 is electrically connected to the first electrode pad 567 and the third electrode pad 570 and the first substrate 521, and electrically isolated from the second substrate 522 and the third substrate 523. As shown in FIG. 19, an embedded capacitor module 500 is formed in an IC carrier board 600, insulating layers 562a, 562b, 562c, 564a, 564b and 564c are respectively formed on upper and lower surfaces of the embedded capacitor module 500, and the embedded capacitor module 500 is built in or embedded in the IC carrier board 600. The IC carrier board 600 also has signal layers 572a, 572b, a power layer 575 and a grounding layer 576, which are respectively formed in the insulating layers 562a, 562b, 562c, 564a, 564b and 564c. During manufacture process, the insulating layer 562a is formed on the second substrate 522 of the embedded capacitor module 500. Then the power layer 575, the insulating layer 562b, the signal layer 572a, and the insulating layer 562c are sequentially formed. Similarly, the insulating layer 564a is formed on the third substrate 523 of the embedded capacitor module 500. Then the grounding layer 576, the insulating layer 564b, the signal layer 572b, and the insulating layer 564c are sequentially formed. Although the layers are collectively named as the insulating layers 562a, 562b, 562c, 564a, 564b and 564c, those skilled in the art should understand that the insulating layers 562a, 562b, 562c, 564a, 564b and 564c, the signal layer 572, the power layer 575 and the grounding layer 576 are laminated or formed layer by layer. An IC 582 is electrically connected to the IC carrier board by solder balls 584 and solder pads 586, that is, at least one of the solder balls of the IC 582 is electrically connected to the grounding layer 576 of the IC carrier board 600, and at least another solder ball is electrically connected to the power layer 575 of the IC carrier board 600. The signal layers 572a, 572b of the IC carrier board are used for transmitting signals. At least one first via 565 is electrically connected to the first substrate 521, the first electrode pad 567, the second electrode pad 568 and the power layer 575 of the IC carrier board 600. At least one second via 566 is electrically connected to the second substrate 522, the third substrate 523 and the grounding layer 576 of the IC carrier board. This architecture provides the capacitance required by the IC 582 on the surface of the IC carrier board.

FIG. 20A and FIG. 20B are cross-section structural and top views of an embedded capacitor module 300 according to another embodiment of the disclosure.

As shown in FIG. 20A and FIG. 20B, the embedded capacitor module 300 comprises electrode lead-out portions 310 and a solid electrolytic capacitor portion 330 adjacently disposed with the electrode lead-out portions 310. In the figures, the solid electrolytic capacitor portion 330 is formed between the two electrode lead-out portions 310. The electrode lead-out portion 310 comprises a first substrate 321, a second substrate 322, a first insulating material 341 disposed between the first substrate 321 and the second substrate 322, a first porous layer 351 and a second porous layer 352 formed on two surfaces of the first substrate 321 respectively, and a first oxide layer 353 and a second oxide layer 354 disposed on the first porous layer 351 and the second porous layer 352 respectively.

The solid electrolytic capacitor portion 330 comprises the first substrate 321 extended from the electrode lead-out portion 310, the second substrate 322 extended from the electrode lead-out portion 310, the first porous layer 351 and the second porous layer 352 extended from the electrode lead-out portion 310 and respectively disposed on two surfaces of the first substrate 321 extended from the electrode lead-out portion 310, the first oxide layer 353 and the second oxide layer 354 extended from the electrode lead-out portion 310 and respectively disposed on the first porous layer 351 and the second porous layer 352 extended from the electrode lead-out portion 310, a first conductive polymer layer 371 disposed on the first oxide layer 353, and a first conductive adhesive layer 373 disposed on the first conductive polymer layer 371. The first conductive adhesive layer 373 is electrically connected to the second substrate 322 and the first conductive polymer layer 371. Because the solid electrolytic capacitor portion 330 is formed between the two electrode lead-out portions 310, the first insulating material 341 contacts with two sides of the first conductive polymer layer 371 and the first conductive adhesive layer 373.

In one embodiment, the material of the first substrate 321 is generally, but is not limited to, aluminum. The material of the second substrate 322 may be conductive material, which is but is not limited to, copper, silver or the like. The material of the first conductive polymer layer 371 may be, but is not limited to, poly(3,4-ethylenedioxythiophene) (PEDOT). The material of the first conductive adhesive layer 373 may be, but is not limited to, silver or other conductive material. The first oxide layer 353 and the second oxide layer 354 are metal oxide layers.

In one embodiment, the first substrate 321 serves as a first electrode of the embedded capacitor module, and the second substrate 322 serves as a second electrode of the embedded capacitor module. The polarities of the first electrode and the second electrode are opposite to each other.

In one embodiment, the embedded capacitor module 300 further comprises a first via 361 and a second via 362. The first via 361, formed in the electrode lead-out portion 310, is electrically connected to the first substrate 321 and electrically isolated from the second substrate 322. The second via 362, formed in the electrode lead-out portion 310, is electrically connected to the second substrate 322 and electrically isolated from the first substrate 321.

In one embodiment, the embedded capacitor module 300 further comprises a first electrode pad 363 disposed on the first insulating material 341, a first pad insulating material 342 disposed around the first electrode pad 363, and a via insulating material 343 disposed around the second via 362 penetrating the first substrate 321 in the electrode lead-out portion 310. The first electrode pad 363 is electrically connected to the first via 361 and the first substrate 321, and electrically isolated from the second substrate 322.

FIG. 21A and FIG. 21B are cross-section structural and top views of an embedded capacitor module 301 according to another embodiment of the disclosure.

The embedded capacitor module 301 comprises electrode lead-out portions 311 and a solid electrolytic capacitor portion 331 adjacently disposed with the electrode lead-out portions 311. In the figures, the solid electrolytic capacitor portion 331 is formed between the two electrode lead-out portions 311. The electrode lead-out portion 311 comprises a first substrate 321, a second substrate 322, a first insulating material 341 disposed between the first substrate 321 and the second substrate 322, a first porous layer 351 and a second porous layer 352 formed on two surfaces of the first substrate 321 respectively, and a first oxide layer 353 and a second oxide layer 354 disposed on the first porous layer 351 and the second porous layer 352 respectively. The electrode lead-out portion 311 further comprises a third substrate 323 and a second insulating material 344 disposed between the first substrate 321. The solid electrolytic capacitor portion 331 further comprises the third substrate 323 extended from the electrode lead-out portion 311.

The solid electrolytic capacitor portion 331 comprises the first substrate 321 extended from the electrode lead-out portion 311, the second substrate 322 extended from the electrode lead-out portion 311, the first porous layer 351 extended from the electrode lead-out portion 311 and formed on at least one surface of the first substrate 321 extended from the electrode lead-out portion 311, and the first oxide layer 353 extended from the electrode lead-out portion 311 and disposed on the first porous layer 351 extended from the electrode lead-out portion 311, a first conductive polymer layer 371 disposed on the first oxide layer 353, and a first conductive adhesive layer 373 disposed on the first conductive polymer layer 371. The first conductive adhesive layer 373 is electrically connected to the second substrate 322 and the first conductive polymer layer 371. The first insulating material 341 contacts with two sides of the first conductive polymer layer 371, and the first conductive adhesive layer 373. The solid electrolytic capacitor portion 331 further comprises a second conductive polymer layer 374 disposed on the second oxide layer 354, and a second conductive adhesive layer 376 disposed on the second conductive polymer layer 374. The second conductive adhesive layer 376 is electrically connected to the third substrate 323 and the second conductive polymer layer 374. The second insulating material 344 contacts with two sides of the second conductive polymer layer 374 and the second conductive adhesive layer 376.

In one embodiment, the material of the first substrate 321 is generally, but is not limited to, aluminum. The material of the second substrate 322 and the third substrate 323 may be conductive material, which is but is not limited to, copper, silver or the like. The material of the first conductive polymer layer 371 and the second conductive polymer layer 374 may be, but is not limited to, poly(3,4-ethylenedioxythiophene) (PEDOT). The material of the first conductive adhesive layer 373 and the second conductive adhesive layer 376 may be, but is not limited to, silver or other conductive material. The first oxide layer 353 and the second oxide layer 354 are metal oxide layers.

In one embodiment, the embedded capacitor module 301 further comprises a first via 365 and a second via 366. The first via 365, formed in the electrode lead-out region 311, is electrically connected to the first substrate 321 and electrically isolated from the second substrate 322 and the third substrate 323. The second via 366, formed in the electrode lead-out region 311, is electrically connected to the second substrate 322 and the third substrate 323 and electrically isolated from the first substrate 321. In this case, the first substrate 321 serves as a first electrode, and the second substrate 322 and the third substrate 323 serves as a second electrode. The polarities of the first electrode and the second electrode are opposite to each other.

In one embodiment, the embedded capacitor module 301 further comprises a first electrode pad 367 disposed on the first insulating material 341, a first pad insulating material 345 disposed around the first electrode pad 367, a second electrode pad 368 disposed on the second insulating material 344, a second pad insulating material 346 disposed around the second electrode pad 368, and a via insulating material 347 disposed around the second via 366 penetrating the first substrate 321 in the electrode lead-out portion 311. The first electrode pad 367 and the second electrode pad 368 are electrically connected to the first via 365 and the first substrate 321, and electrically isolated from the second substrate 322 and the third substrate 323.

Figure 22A:
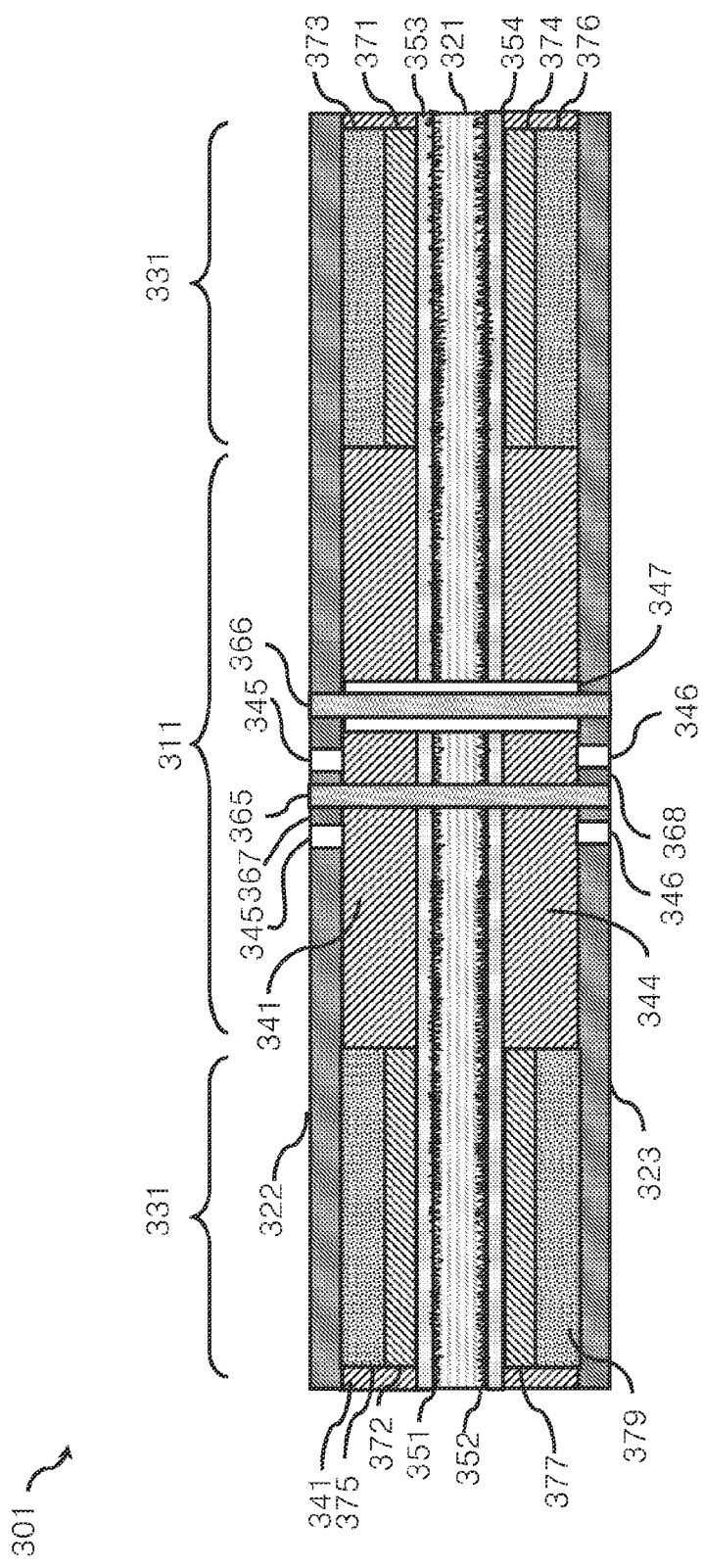

FIG. 22A, FIG. 22B, and FIG. 22C are cross-section structural and top views of an embedded capacitor module 301 according to another embodiment of the disclosure.

In this embodiment, most of the components having the same reference numbers are have similar or the same composition or operation as those in the embodiment of FIG. 21A and FIG. 21B.

In this embodiment, the solid electrolytic capacitor portion 331 further comprises a third conductive polymer layer 372 disposed on the first oxide layer 353, and a third conductive adhesive layer 375 disposed on third conductive polymer layer 372. The third conductive adhesive layer 375 is electrically connected to the second substrate 322 and the third conductive polymer layer 372. The first insulating material 341 contacts with two sides of the third conductive polymer layer 372 and the third conductive adhesive layer 375.

In this embodiment, the solid electrolytic capacitor portion 331 further comprises a forth conductive polymer layer 377 disposed on the second oxide layer 354, and a forth conductive adhesive layer 379 disposed on forth conductive polymer layer 377. The forth conductive adhesive layer 379 is electrically connected to the third substrate 323 and the forth conductive polymer layer 377. The second insulating material 344 contacts with two sides of the forth conductive polymer layer 377 and the forth conductive adhesive layer 379.

Refer to FIG. 22B illustrating the top view of the embedded capacitor module 301 according to the embodiment of FIG. 22A. In this embodiment, the first conductive polymer layer 371, the first conductive adhesive layer 373, the second conductive polymer layer 374 and the second conductive adhesive layer 376 are arranged on the same location, in view of the vertical direction of the module. Similarly, the third conductive polymer layer 372, the third conductive adhesive layer 375, the forth conductive polymer layer 377 and the forth conductive adhesive layer 379 are arranged on the same location, in view of the vertical direction of the module.

Refer to FIG. 22C illustrating the top view of the embedded capacitor module 301 according to the embodiment of FIG. 22A. In this embodiment, the first conductive polymer layer 371, the first conductive adhesive layer 373, the second conductive polymer layer 374 and the second conductive adhesive layer 376 are arranged on different location, in view of the vertical direction of the module. Similarly, the third conductive polymer layer 372, the third conductive adhesive layer 375, the forth conductive polymer layer 377 and the forth conductive adhesive layer 379 are arranged on different location, in view of the vertical direction of the module.

Figure 23:
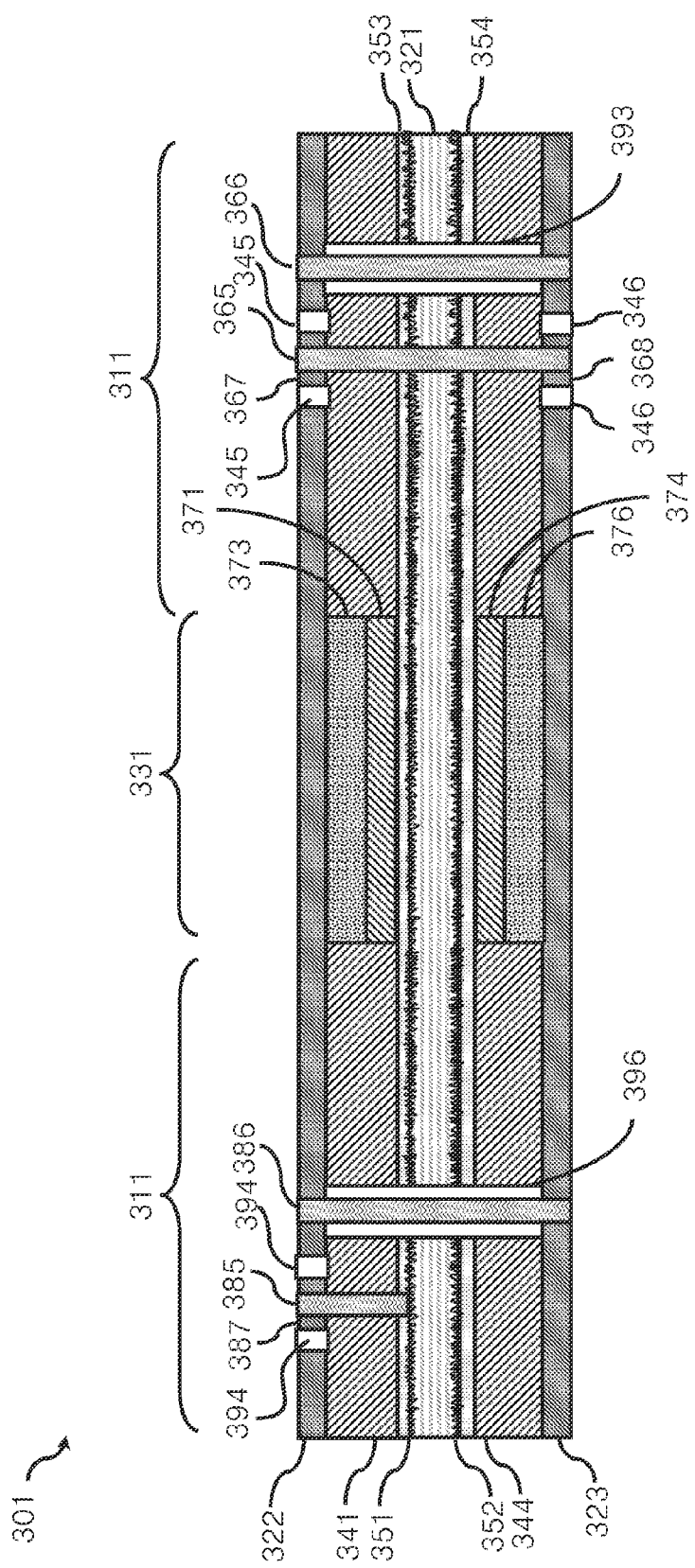
FIG. 23 is cross-section structural and top views of an embedded capacitor module according to another embodiment of the disclosure.

FIG. 23 are cross-section structural view of an embedded capacitor module 301 according to another embodiment of the disclosure.

In this embodiment, most of the components having the same reference numbers are have similar or the same composition or operation as those in the embodiment of FIG. 21A and FIG. 21B.

In one embodiment, the embedded capacitor module 301 further comprises a third via 385 and a forth via 386. The third via 385, formed in the electrode lead-out portion 311, is electrically connected to the first substrate 321 and electrically isolated from the second substrate 322 and the third substrate 323. The third via 385 is a blind via. The forth via 386, formed in the electrode lead-out portion 311, is electrically connected to the second substrate 322 and the third substrate 323 and electrically isolated from the first substrate 321. The forth via 386 is a through via.

In one embodiment, the embedded capacitor module 301 further comprises a third electrode pad 387 disposed on the first insulating material 341, a first pad insulating material 394 disposed around the third electrode pad 387, and a via insulating material 396 disposed around the forth via 386 penetrating the first substrate 321. The third electrode pad 387 is electrically connected to the third via 385 and the first substrate 321, and electrically isolated from the second substrate 322 and the third substrate 323. The first via 365, the third via 385, the first electrode pad 367, the second electrode pad 368 and the third electrode pad 387 are electrically connected to the first substrate 321.

According to the embodiments set forth, the embedded capacitor modules of the disclosure are in having a large capacitance as the conventional solid capacitor, but also capable of being drilled and plated in the electrode lead-out portion and electrically connected to other circuits after being embedded in a printed circuit board. In addition, the capacitance of the embedded capacitor modules is not decreased after the drilled holes or plated through holes penetrated electrode lead-out portion of the embedded capacitor module.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An embedded capacitor module, comprising:
    an electrode lead-out portion comprises a first substrate, a second substrate, a first insulating material disposed between the first substrate and the second substrate, a first porous layer formed on at least one surface of the first substrate, and a first oxide layer disposed on the first porous layer; and at least one solid electrolytic capacitor portion adjacently disposed with the electrode lead-out portion, wherein the solid electrolytic capacitor portion comprises the first substrate extended from the electrode lead-out portion, the second substrate extended from the electrode lead-out portion, the first porous layer extended from the electrode lead-out portion and formed on at least one surface of the first substrate extended from the electrode lead-out portion, the first oxide layer extended from the electrode lead-out portion and disposed on the first porous layer extended from the electrode lead-out portion, a first conductive polymer layer disposed on the first oxide layer, a first carbon layer disposed on the first conductive polymer layer, and a first conductive adhesive layer disposed on the first carbon layer, wherein the first conductive adhesive layer is electrically connected to the second substrate and the first carbon layer, and the first insulating material contacts with at least one side of the first conductive polymer layer, the first carbon layer and the first conductive adhesive layer;
    a first via, formed in the electrode lead-out portion, electrically connected to the first substrate and electrically isolated from the second substrate; and a second via, formed in the electrode lead-out portion, electrically connected to the second substrate and electrically isolated from the first substrate.

2. The embedded capacitor module according to claim 1, wherein the first oxide layer is a metal oxide layer.

3. The embedded capacitor module according to claim 1, wherein the first porous layer is partly or completely disposed on the surface of the first substrate.

4. The embedded capacitor module according to claim 1, wherein the first substrate serves as a first electrode of the embedded capacitor module, and the second substrate serves as a second electrode of the embedded capacitor module.

5. The embedded capacitor module according to claim 1, further comprising a first electrode pad disposed on the first insulating material, a first pad insulating material disposed around the first electrode pad, and a via insulating material disposed around the second via penetrating the first substrate, wherein the first electrode pad is electrically connected to the first via and electrically isolated from the second substrate.

6. The embedded capacitor module according to claim 1, wherein the first via is a through via.

7. The embedded capacitor module according to claim 1, wherein the first via is a blind via.

8. The embedded capacitor module according to claim 1, further comprising a third substrate and a second insulating material disposed between the first substrate and the third substrate in the electrode lead-out portion and the solid electrolytic capacitor portion.

9. The embedded capacitor module according to claim 8, further comprising:
    a first via, formed in the electrode lead-out region, electrically connected to the first substrate and electrically isolated from the second substrate and the third substrate; and
    a second via, formed in the electrode lead-out region, electrically connected to the second substrate and the third substrate and electrically isolated from the first substrate.

10. The embedded capacitor module according to claim 9, further comprising a first electrode pad disposed on the first insulating material, a first pad insulating material disposed around the first electrode pad, a second electrode pad disposed on the second insulating material, a second pad insulating material disposed around the second electrode pad, a via insulating material disposed around the second via penetrating the first substrate, wherein the first electrode pad and the second electrode pad are electrically connected to the first via and electrically isolated from the second substrate and the third substrate.

11. The embedded capacitor module according to claim 1, wherein the electrode lead-out portion further comprises a third substrate and a second insulating material disposed between the first substrate and the third substrate, and the solid electrolytic capacitor portion further comprises the third substrate extended from the electrode lead-out portion.

12. The embedded capacitor module according to claim 11, wherein at least one solid electrolytic capacitor portion adjacently disposed with the electrode lead-out portion, wherein the solid electrolytic capacitor portion further comprises a second porous layer extended from the electrode lead-out portion and formed on the surface of the first substrate extended from the electrode lead-out portion, a second oxide layer extended from the electrode lead-out portion and disposed on the second porous layer extended from the electrode lead-out portion, a second conductive polymer layer disposed on the second oxide layer, a second carbon layer disposed on the second conductive polymer layer, and a second conductive adhesive layer disposed on the second carbon layer, wherein the second conductive adhesive layer is electrically connected to the third substrate and the second carbon layer, and the second insulating material contacts with at least one side of the second conductive polymer layer, the second carbon layer, and the second conductive adhesive layer.

13. The embedded capacitor module according to claim 12, wherein the second porous layer partly or completely disposed on the surface of the first substrate.

14. The embedded capacitor module according to claim 11, further comprising:
    a first via, formed in the electrode lead-out region, electrically connected to the first substrate and electrically isolated from the second substrate and the third substrate;

a second via, formed in the electrode lead-out region, electrically connected to the second substrate and the third substrate and electrically isolated from the first substrate.

15. The embedded capacitor module according to claim 14, wherein the first via is a through via.

16. The embedded capacitor module according to claim 14, wherein the first via is a blind via.

17. The embedded capacitor module according to claim 14, further comprising a first electrode pad disposed on the first insulating material, a first pad insulating material disposed around the first electrode pad, a second electrode pad disposed on the second insulating material, a second pad insulating material disposed around the second electrode pad, a via insulating material disposed around the second via penetrating the first substrate, wherein the first electrode pad and the second electrode pad are electrically connected to the first via and electrically isolated from the second substrate and the third substrate.

18. The embedded capacitor module according to claim 17, further comprising a third via, formed in the electrode lead-out region, electrically connected to the first substrate and the second electrode pad and electrically isolated from the second substrate and the third substrate.

19. The embedded capacitor module according to claim 11, wherein the solid electrolytic capacitor portion further comprises a first conductive adhesive layer disposed between the first carbon layer and the second substrate, and a second conductive adhesive layer disposed between the first carbon layer and the third substrate, wherein the first insulating material contacts with one side of the first conductive polymer layer, the first carbon layer and the first conductive adhesive layer, and the second insulating material contacts with one side of the first conductive polymer layer, the first carbon layer and the second conductive adhesive layer.

20. The embedded capacitor module according to claim 19, wherein the first conductive adhesive layer is electrically connected to the second substrate and the first carbon layer, and the second conductive adhesive layer is electrically connected to the third substrate and the first carbon layer.

21. The embedded capacitor module according to claim 1, wherein the solid electrolytic capacitor portion is surrounding adjacently disposed with the electrode lead-out portion.

22. An embedded capacitor module, comprising:
at least one electrode lead-out portion comprises a first substrate, a second substrate, an first insulating material disposed between the first substrate and the second substrate, a first porous layer formed on the surface of the first substrate, and a first oxide layer disposed on the porous layer; and
at least one solid electrolytic capacitor portion adjacently disposed with the electrode lead-out portion, wherein the solid electrolytic capacitor portion comprises the first substrate extended from the electrode lead-out portion, the second substrate extended from the electrode lead-out portion, the first porous layer extended from the electrode lead-out portion and formed on at least one surface of the first substrate extended from the electrode lead-out portion, the first oxide layer extended from the electrode lead-out portion and disposed on the first porous layer extended from the electrode lead-out portion, a first conductive polymer layer disposed on the first oxide layer, and a first conductive adhesive layer disposed on the first conductive polymer layer, wherein the first conductive adhesive layer is electrically connected to the second substrate and the first conductive polymer layer, and the first insulating material contacts with at least one side of the first conductive polymer layer and the first conductive adhesive layer;
a first via, formed in the electrode lead-out region, electrically connected to the first substrate and electrically isolated from the second substrate; and
a second via, formed in the electrode lead-out region, electrically connected to the second substrate and electrically isolated from the first substrate.

23. The embedded capacitor module according to claim 22, wherein the first oxide layer is a metal oxide layer.

24. The embedded capacitor module according to claim 22, wherein the first substrate serves as a first electrode of the embedded capacitor module, and the second substrate serves as a second electrode of the embedded capacitor module.

25. The embedded capacitor module according to claim 22, further comprising a first electrode pad disposed on the first insulating material, a first pad insulating material disposed around the first electrode pad, and a via insulating material disposed around the second via penetrating the first substrate, wherein the first electrode pad is electrically connected to the first via and electrically isolated from the second substrate.

26. The embedded capacitor module according to claim 22, wherein the first via is a through via.

27. The embedded capacitor module according to claim 22, wherein the first via is a blind via.

28. The embedded capacitor module according to claim 22, wherein the electrode lead-out portion further comprises a third substrate and a second insulating material disposed between the first substrate and the third substrate, and the solid electrolytic capacitor portion further comprises the third substrate extended from the electrode lead-out portion.

29. The embedded capacitor module according to claim 28, wherein at least one solid electrolytic capacitor portion adjacently disposed with the electrode lead-out portion, wherein the solid electrolytic capacitor portion further comprises a second porous layer extended from the electrode lead-out portion and formed on the surface of the first substrate extended from the electrode lead-out portion, a second oxide layer extended from the electrode lead-out portion and disposed on the second porous layer extended from the electrode lead-out portion, a second conductive polymer layer disposed on the second oxide layer, and a second conductive adhesive layer disposed on the second conductive polymer layer, wherein the second conductive adhesive layer is electrically connected to the third substrate and the second conductive polymer layer, and the second insulating material contacts with at lease one side of the second conductive polymer layer and the second conductive adhesive layer.

30. The embedded capacitor module according to claim 29 further comprising
at least one first via, formed in the electrode lead-out region, electrically connected to the first substrate and electrically isolated from the second substrate and the third substrate; and
at least one second via, formed in the electrode lead-out region, electrically connected to the second substrate and the third substrate and electrically isolated from the first substrate.

31. The embedded capacitor module according to claim 30, further comprises a first electrode pad disposed on the first insulating material, a first pad insulating material disposed around the first electrode pad, a second electrode pad disposed on the second insulating material, a second pad insulating material disposed around the second electrode pad, a via insulating material disposed around the second via penetrating the first substrate, wherein the first electrode pad and the second electrode pad are electrically connected to the first via and electrically isolated from the second substrate and the third substrate.

32. The embedded capacitor module according to claim 30, wherein the first via is a through via.

33. The embedded capacitor module according to claim 30, wherein the first via is a blind via.

34. The embedded capacitor module according to claim 22, further comprising a first solid electrolytic capacitor portion adjacently disposed with the electrode lead-out portion and a second solid electrolytic capacitor portion disposed oppositely side of the electrode lead-out portion, wherein the first solid electrolytic capacitor portion and the second solid electrolytic capacitor portion separate with each other.

35. The embedded capacitor module according to claim 34, further comprising a third solid electrolytic capacitor portion and a fourth solid electrolytic capacitor portion, wherein the first solid electrolytic capacitor portion, the second solid electrolytic capacitor portion, the third solid electrolytic capacitor portion, and the fourth solid electrolytic capacitor portion separate with each other.

\* \* \* \* \*